United States Patent
Ichimura

(10) Patent No.: US 10,593,337 B2
(45) Date of Patent: Mar. 17, 2020

(54) TRANSMISSION APPARATUS, TRANSMISSION METHOD, RECEPTION APPARATUS, AND RECEPTION METHOD

(71) Applicant: SONY CORPORATION, Tokyo (JP)

(72) Inventor: Gen Ichimura, Tokyo (JP)

(73) Assignee: SONY CORPORATION, Tokyo (JP)

( * ) Notice: Subject to any disclaimer, the term of this patent is extended or adjusted under 35 U.S.C. 154(b) by 113 days.

(21) Appl. No.: 15/741,376

(22) PCT Filed: Jul. 5, 2016

(86) PCT No.: PCT/JP2016/069954
§ 371 (c)(1),
(2) Date: Jan. 2, 2018

(87) PCT Pub. No.: WO2017/010358
PCT Pub. Date: Jan. 19, 2017

(65) Prior Publication Data
US 2019/0005968 A1   Jan. 3, 2019

(30) Foreign Application Priority Data
Jul. 10, 2015 (JP) .................. 2015-138212

(51) Int. Cl.
*G10L 19/008* (2013.01)
*H04N 21/439* (2011.01)
(Continued)

(52) U.S. Cl.
CPC ............ *G10L 19/008* (2013.01); *G10L 19/09* (2013.01); *G10L 19/167* (2013.01);
(Continued)

(58) Field of Classification Search
CPC ........................ H04N 21/436; G10L 19/008
(Continued)

(56) References Cited

U.S. PATENT DOCUMENTS 7,809,346 B2 * 10/2010 Risbo ................. H03F 3/217
455/296
10,365,886 B2 * 7/2019 Clayton ................. G06F 3/165
2010/0118927 A1  5/2010 Ichimura et al.

FOREIGN PATENT DOCUMENTS

CN    101743713 A    6/2010
EP    2278748 A1    1/2011
(Continued)

OTHER PUBLICATIONS

"IEC 60958-3 Amendment 1 Edition 3.0" [online], [retrieval date Sep. 12, 2016], Internet:<URL:http://www.meconinfo.co.in/IECPDF/pdf/iec60958-3-amd1%7Bed3.0%7Den.pdf>, Oct. 2009.
(Continued)

Primary Examiner — Susan I McFadden
(74) Attorney, Agent, or Firm — Chip Law Group

(57) ABSTRACT

To enable to favorably send a compressed digital audio signal at a high data rate. First, second, and third metadata are added to a compressed digital audio signal of a predetermined number of channels. The first metadata is metadata indicating a sending frequency of the compressed digital audio signal. The second metadata is metadata indicating a sampling frequency used for converting an uncompressed digital audio signal of each channel into an analog signal. The third metadata is metadata indicating a ratio of the sending frequency to the sampling frequency. The compressed digital audio signal provided with each type of the metadata is transmitted to an external device through a predetermined sending path.

16 Claims, 19 Drawing Sheets

(51) Int. Cl.
   *G10L 19/16*     (2013.01)
   *H04N 21/4363*   (2011.01)
   *H04N 21/43*     (2011.01)
   *G10L 19/09*     (2013.01)
   *H03M 7/38*      (2006.01)
   *H03M 7/30*      (2006.01)
   *H03M 5/12*      (2006.01)
   *H04N 21/84*     (2011.01)

(52) U.S. Cl.
   CPC ...... *H03M 7/3046* (2013.01); *H04N 21/4307* (2013.01); *H04N 21/439* (2013.01); *H04N 21/43635* (2013.01); *H03M 5/12* (2013.01); *H03M 7/30* (2013.01); *H04N 21/4392* (2013.01); *H04N 21/84* (2013.01)

(58) Field of Classification Search
   USPC .......................................................... 704/500
   See application file for complete search history.

(56) References Cited

FOREIGN PATENT DOCUMENTS

KR   10-2011-0009608 A   1/2011
WO      2009/139386 A1   11/2009

OTHER PUBLICATIONS

International Search Report and Written Opinion of PCT Application No. PCT/JP2016/069954, dated Sep. 20, 2016, 06 pages of ISRWO.

\* cited by examiner

FIG. 8

HDMI PINOUT (CASE OF TYPE-A)

| PIN | Signal Assignment | PIN | Signal Assignment |
|---|---|---|---|
| 1 | TMDS Data2+ | 2 | TMDS Data2 Shield |
| 3 | TMDS Data2− | 4 | TMDS Data1+ |
| 5 | TMDS Data1 Shield | 6 | TMDS Data1− |
| 7 | TMDS Data0+ | 8 | TMDS Data0 Shield |
| 9 | TMDS Data0− | 10 | TMDS Clock+ |
| 11 | TMDS Clock Shield | 12 | TMDS Clock− |
| 13 | CEC | 14 | Reserved (N.C. on device) |
| 15 | SCL | 16 | SDA |
| 17 | DDC/CEC Ground | 18 | +5V Power |
| 19 | Hot Plug Detect | | |

| PREAMBLE | CHANNEL CODING | | |
|---|---|---|---|
| | | SUB-FRAME #1, BLOCK START | |
| "B" | 11101000 | 00010111 | |
| "M" | 11100010 | 00011101 | SUB-FRAME #1 |
| "W" | 11100100 | 00011011 | SUB-FRAME #2 |
| | 0 | 1 | |
| | (PRECEDING STATE) | | |

FIG.16

| byte | | | | | | | | |
|---|---|---|---|---|---|---|---|---|
| 0 | a = "0" | b = "1" | c | | d | | Mode = "0 0" | |
| | 0 | 1 | 2 | 3 | 4 | 5 | 6 | 7 |
| 1 | Category code ||||||||
| | 8 | 9 | 10 | 11 | 12 | 13 | 14 | 15 |
| 2 | Source number | | | | Channel number | | | |
| | 16 | 17 | 18 | 19 | 20 | 21 | 22 | 23 |
| 3 | IEC 60958 Frame Rate | | | | Clock accuracy | | IEC 60958 Frame Rate | |
| | 24 | 25 | 26 | 27 | 28 | 29 | 30 | 31 |
| 4 | Word length | | | | Original sampling frequency | | | |
| | 32 | 33 | 34 | 35 | 36 | 37 | 38 | 39 |
| 5 | CGMS-A | CGMS-A validity | | Audio sampling frequency coefficient | | | | |
| | 40 | 41 | 42 | 43 | 44 | 45 | 46 | 47 |

FIG.17

| Byte0 of Channel status | | Specifications |
|---|---|---|
| Bit0 | Bit1 | |
| 0 | 0 | IEC 60958-3 |
| 1 | 0 | IEC 60958-4 |
| 0 | 1 | IEC 61937, IEC 62105 and others |
| 1 | 1 | SMPTE 337M and others |

FIG. 18

| Bit 24 - 27 | Bit 30 - 31 | IEC 60958 Frame Rate |
|---|---|---|
| 0000b | (00b) | 44.1 kHz |
| 1000b | (00b) | Sampling frequency not indicated |
| 0100b | (00b) | 48 kHz |
| 1100b | (00b) | 32 kHz |
| 0010b | (00b) | 22.05 kHz |
| 1010b | 00b | 384 kHz |
| 1010b | 10b | 1536 kHz |
| 1010b | 01b | reserved |
| 1010b | 11b | 1024 kHz |
| 0110b | (00b) | 24 kHz |
| 1110b | 00b – 11b | reserved |
| 0001b | (00b) | 88.2 kHz |
| 1001b | (00b) | 768 kHz |
| 0101b | (00b) | 96 kHz |
| 1101b | 00b | 64 kHz |
| 1101b | 01b | 128 kHz |
| 1101b | 10b | 256 kHz |
| 1101b | 11b | 512 kHz |
| 0011b | (00b) | 176.4 kHz |
| 1011b | 00b | 352.8 kHz |
| 1011b | 01b | 705.6 kHz |
| 1011b | 10b | 1411.2 kHz |
| 1011b | 11b | reserved |
| 0111b | (00b) | 192 kHz |
| 1111b | 00b – 11b | reserved |

FIG.19

| Bit 36 - 39 | Original sampling frequency |
|---|---|
| 1111b | 44.1 kHz |
| 1110b | 88.2 kHz |
| 1101b | 22.05 kHz |
| 1100b | 176.4 kHz |
| 1011b | 48 kHz |
| 1010b | 96 kHz |
| 1001b | 24 kHz |
| 1000b | 192 kHz |
| 0111b | 128 kHz |
| 0110b | 8 kHz |
| 0101b | 11.025 kHz |
| 0100b | 12 kHz |
| 0011b | 32 kHz |
| 0010b | 64 kHz |
| 0001b | 16 kHz |
| 0000b | Original sampling frequency not indicated(default) |

FIG.20

| Bit 44 - 47 | Audio sampling frequency coefficient |
|---|---|
| 0000b | No indication |
| 0001b | Equal to transmission sampling frequency |
| 0010b | 1/2 |
| 0011b | 1/4 |
| 0100b | 1/8 |
| 0101b | 1/16 |
| 0110b | 1/32 |
| 0111b | Reserved |
| 1000b | Reserved |
| 1001b | Reserved |
| 1010b | Reserved |
| 1011b | 32 |
| 1100b | 16 |
| 1101b | 8 |
| 1110b | 4 |
| 1111b | 2 |

TRANSMISSION APPARATUS, TRANSMISSION METHOD, RECEPTION APPARATUS, AND RECEPTION METHOD

CROSS REFERENCE TO RELATED APPLICATIONS

This application is a U.S. National Phase of International Patent Application No. PCT/JP2016/069954 filed on Jul. 5, 2016, which claims priority benefit of Japanese Patent Application No. JP 2015-138212 filed in the Japan Patent Office on Jul. 10, 2015. Each of the above-referenced applications is hereby incorporated herein by reference in its entirety.

TECHNICAL FIELD

The present invention relates to a transmission apparatus, a transmission method, a reception apparatus, and a reception method, and particularly, to a transmission apparatus, a reception apparatus, and the like that transmit and receive a compressed digital audio signal.

BACKGROUND ART

For example, the standard international electrotechnical commission (IEC) 60958 is described in PTL 1. IEC 61937 is a standard for sending a compressed digital audio signal packetized based on IEC 60958-3, and IEC 61937-6 defines a sending method of moving picture experts group (MPEG)-2 adaptive audio coding (AAC). In the sending with MPEG-2 AAC used in television broadcast, 2 channels and 5.1 channels are compressed, and the output is at the same sending rate as linear pulse-code modulation (LPCM) 48 kHz 2 channels defined in IEC 60958-3.

CITATION LIST

Patent Literature

[PTL 1]
JP 2009-130606A

SUMMARY

Technical Problem

MPEG-4 AAC is used in the next-generation television broadcast. The number of audio channels is up to 22.2 channels, and the data rate is increasing. The IEC 61937-11 standard is applied to output the signal to the outside. The standard is a standard for sending a compressed digital audio signal of MPEG-4 AAC in a low overhead audio transport multiplex/low overhead audio stream (LATM/LOAS) format.

However, the sending frequency is the same as the sampling frequency in this standard, and the sending needs to be performed at 48 kHz when the sampling frequency is 48 kHz. When a multichannel digital audio signal is compressed and sent, such as in the case of 22.2 channels, the data rate exceeds the rate that allows sending at 48 kHz.

In this case, the signal may be sent at, for example, 96 kHz. However, in this case, the device receiving the signal transmitted at 96 kHz executes a wrong process of converting the signal into an analog signal at 96 kHz that is supposed to be converted into an analog signal at 48 kHz. Furthermore, display of 96 kHz reproduction is presented to the user, and this misleads the user into thinking that an audio signal of equal to or not less than 24 kHz is reproduced.

An object of the present technique is to enable to favorably send a compressed digital audio signal at a high data rate.

Solution to Problem

An aspect of the present technique provides a transmission apparatus including:

a metadata addition unit that adds, to a compressed digital audio signal of a predetermined number of channels, first metadata indicating a sending frequency of the compressed digital audio signal, second metadata indicating a sampling frequency used for converting an uncompressed digital audio signal of each channel into an analog signal, and third metadata indicating a ratio of the sending frequency to the sampling frequency; and a transmission unit that transmits the compressed digital audio signal provided with each type of the metadata to an external device through a predetermined sending path.

In the present technique, the metadata addition unit adds the first, second, and third metadata to the compressed digital audio signal of the predetermined number of channels. For example, an encoding system of the compressed digital audio signal may be MPEG-4 AAC. In this case, the predetermined number of channels may be 22.2 channels. For example, an acquisition unit that acquires the compressed digital audio signal from a broadcast signal or that reproduces the compressed digital audio signal from a recording medium to acquire the compressed digital audio signal may be further included.

Here, the first metadata is metadata indicating the sending frequency of the compressed digital audio signal. The second metadata is metadata indicating the sampling frequency used for converting the uncompressed digital audio signal of each channel into an analog signal. The third metadata is metadata indicating the ratio of the sending frequency to the sampling frequency.

The transmission unit transmits the compressed digital audio signal provided with each type of the metadata to an external device through a predetermined sending path. For example, the predetermined sending path may be a coaxial cable, an optical cable, an Ethernet (IEC 61883-6) cable, a high definition multimedia interface (HDMI) cable, a mobile high-definition link (MHL) cable, or a display port cable.

For example, the transmission unit may sequentially transmit the compressed digital audio signal on a basis of unit data, and the metadata addition unit may use a predetermined bit area of a channel status of each block constituted by a predetermined number of continuous pieces of the unit data to add each type of the metadata.

In this way, three types of metadata are added to the compressed digital audio signal to be transmitted in the present technique. Therefore, a compressed digital audio signal at a high data rate can be sent favorably. More specifically, the signal can be sent at a sending rate different from the sampling frequency. Sound can be correctly reproduced at the original sampling frequency different from the sending rate, and the audio frequency band for actually reproducing the sound can be clearly presented to the user.

Another aspect of the present technique provides a reception apparatus including:

a reception unit that receives a compressed digital audio signal of a predetermined number of channels from an external device through a predetermined sending path, wherein first metadata indicating a sending frequency of the compressed digital audio signal, second metadata indicating a sampling frequency used for converting an uncompressed digital audio signal of each channel into an analog signal, and third metadata indicating a ratio of the sending frequency to the sampling frequency are added to the compressed digital audio signal; and a processing unit that executes a process related to the compressed digital audio signal based on at least one type of the metadata.

In the present technique, the reception unit receives the compressed digital audio signal of the predetermined number of channels from the external device through the predetermined sending path. For example, the predetermined sending path may be a coaxial cable, an optical cable, an Ethernet (IEC 61883-6) cable, an HDMI cable, an MHL cable, or a display port cable.

The first, second, and third metadata are added to the compressed digital audio signal. For example, the reception unit may sequentially receive the compressed digital audio signal on a basis of unit data, and a predetermined bit area of a channel status of each block constituted by a predetermined number of continuous pieces of the unit data may be used to add each type of the metadata to the compressed digital audio signal.

Here, the first metadata is metadata indicating the sending frequency of the compressed digital audio signal. The second metadata is metadata indicating the sampling frequency used for converting the uncompressed digital audio signal of each channel into an analog signal. The third metadata is metadata indicating the ratio of the sending frequency to the sampling frequency.

The processing unit executes the process related to the compressed digital audio signal based on at least one type of the metadata. For example, the processing unit may lock a phase-locked loop (PLL) to a frequency according to the sending frequency indicated in the first metadata and use a clock signal at the frequency locked by the PLL to apply a decoding process to the compressed digital audio signal to obtain an uncompressed digital audio signal of each channel of the predetermined number of channels.

For example, the processing unit may convert the uncompressed digital audio signal of each channel obtained by applying the decoding process to the compressed digital audio signal into an analog signal at the sampling frequency indicated in the second metadata and output the analog signal.

For example, the processing unit may display, on a display unit, the sampling frequency indicated in the second metadata as a sampling frequency of the output analog audio signal of each channel.

For example, the processing unit may use the sending frequency indicated in the first metadata or the ratio indicated in the third metadata to display the sending frequency of the compressed digital audio signal on the display unit.

For example, the processing unit may compare a ratio of the sending frequency indicated in the first metadata to the sampling frequency indicated in the second metadata with the ratio indicated in the third metadata to detect an error of the first metadata or the second metadata.

In this way, the process related to the compressed digital audio signal is executed based on the metadata added to the compressed digital audio signal in the present technique. Therefore, the process related to the compressed digital audio signal, such as a decoding process, a process of converting the signal into an analog signal, and a process of clearly presenting the reproduction audio frequency band to the user, is appropriately executed.

Advantageous Effect of Invention

According to the present technique, the compressed digital audio signal at a high data rate can be sent favorably. Note that the advantageous effect described in the present specification is illustrative only, and the advantageous effect is not limited. There may also be additional advantageous effects.

BRIEF DESCRIPTION OF DRAWINGS

FIGS. 4(a) and 4(b) is a are diagrams depicting a display example of a sending frequency, a sampling frequency, and the like.

FIG. 8 is a diagram depicting a pinout of an HDMI connector.

FIG. 10 is a diagram depicting a configuration example of a high-speed bus interface of the audio amplifier.

FIG. 14 is a diagram depicting channel coding of preambles based on the standard IEC 60958.

Hereinafter, a mode for carrying out the invention (hereinafter, referred to as "embodiment") will be described. Note that the description is in the following order.

1. Embodiment
2. Modification

1. Embodiment

Configuration Example of AV System

Figure 1:
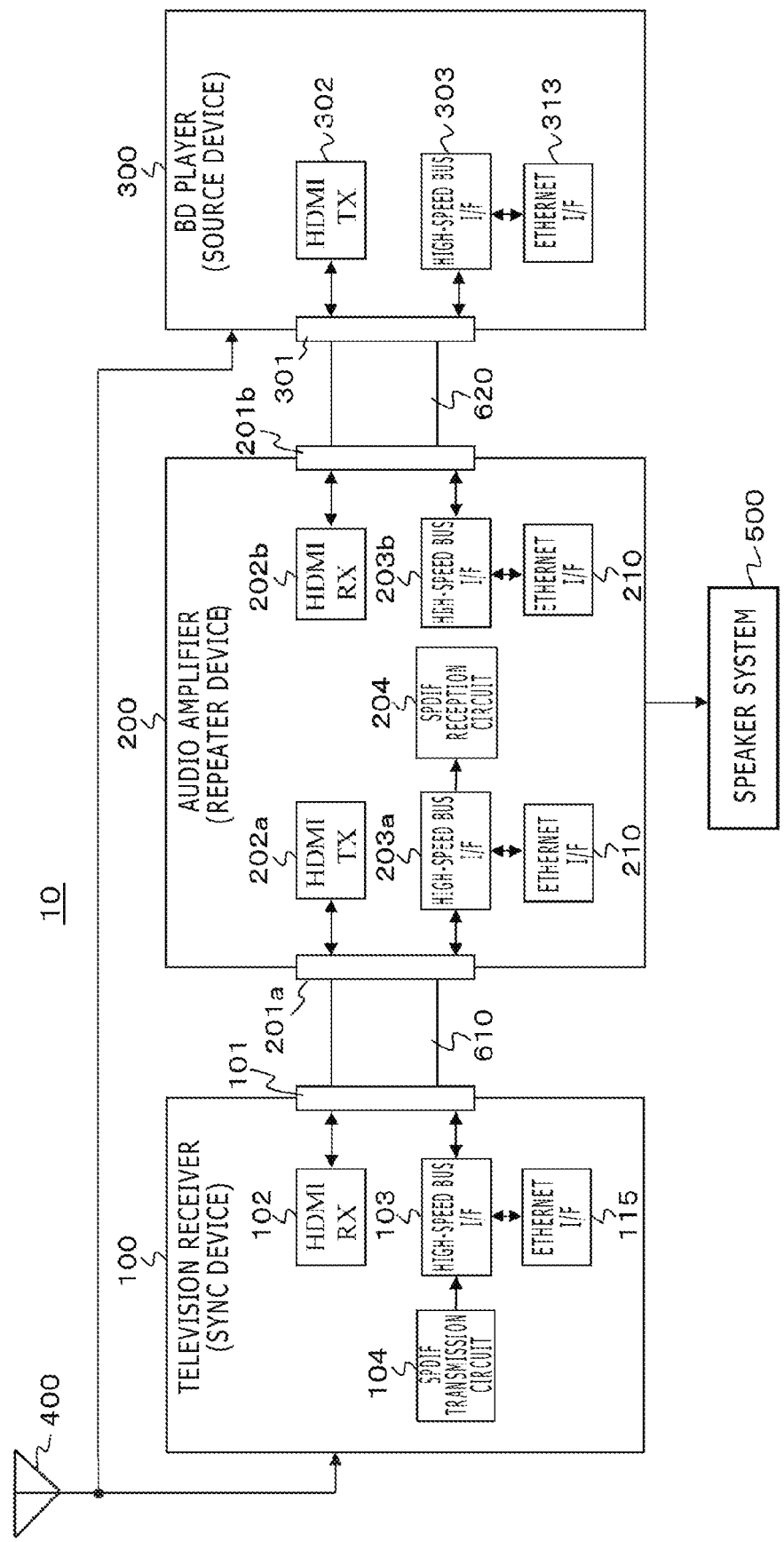
FIG. 1 is a block diagram depicting a configuration example of an audio and visual (AV) system as an embodiment.

FIG. 1 depicts a configuration example of an AV system 10 as an embodiment. The AV system 10 includes a television receiver 100 as a sync device, an audio amplifier 200 as a repeater device, and a BD (Blu-Ray Disc) player 300 as a source device. A reception antenna 400 of television broadcast is connected to the television receiver 100 and the BD player 300. A speaker system 500 for 2 channels or for multiple channels is connected to the audio amplifier 200.

The television receiver 100 and the audio amplifier 200 are connected through an HDMI cable 610. The television receiver 100 is provided with an HDMI terminal 101, wherein an HDMI reception unit (HDMI RX) 102 and a high-speed bus interface 103 that constitutes a communication unit are connected to the HDMI terminal 101. Note that "HDMI" is a registered trademark.

The audio amplifier 200 is provided with an HDMI terminal 201a, wherein an HDMI transmission unit (HDMI TX) 202a and a high-speed bus interface 203a that constitutes a communication unit are connected to the HDMI terminal 201a. One end of the HDMI cable 610 is connected to the HDMI terminal 101 of the television receiver 100, and the other end of the HDMI cable 610 is connected to the HDMI terminal 201a of the audio amplifier 200.

The audio amplifier 200 and the BD player 300 are connected through an HDMI cable 620. The audio amplifier 200 is provided with an HDMI terminal 201b, wherein an HDMI reception unit (HDMI RX) 202b and a high-speed bus interface 203b that constitutes a communication unit are connected to the HDMI terminal 201b.

The BD player 300 is provided with an HDMI terminal 301, wherein an HDMI transmission unit (HDNI TX) 302 and a high-speed bus interface 303 that constitutes a communication unit are connected to the HDMI terminal 301. One end of the HDMI cable 620 is connected to the HDMI terminal 201b of the audio amplifier 200, and the other end of the HDMI cable 620 is connected to the HDMI terminal 301 of the BD player 300.

Configuration Example of Television Receiver

Figure 2:
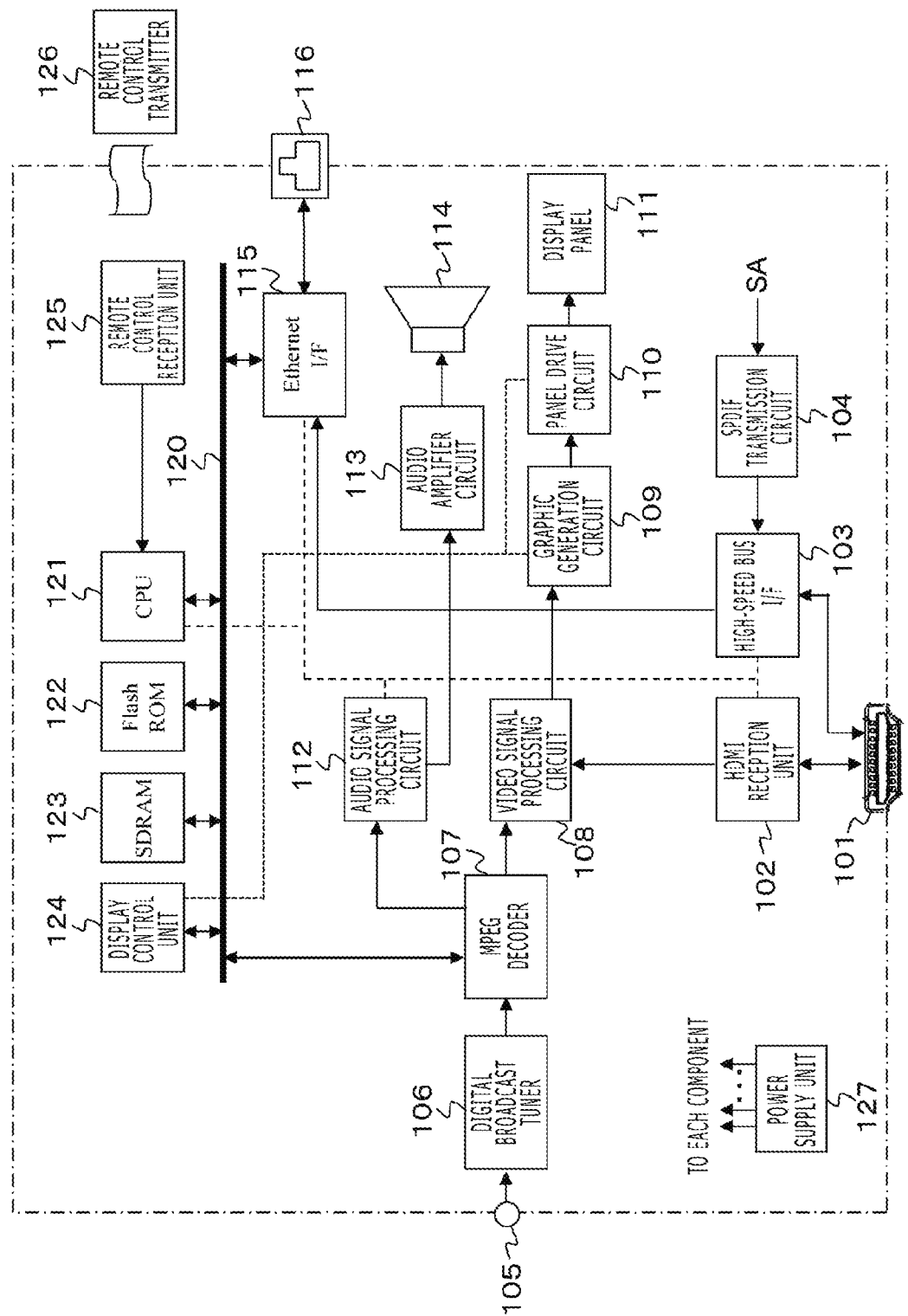
FIG. 2 is a block diagram depicting a configuration example of a television receiver constituting the AV system.

FIG. 2 depicts a configuration example of the television receiver 100. The television receiver 100 includes the HDMI terminal 101, the HDMI reception unit 102, the high-speed bus interface 103, and an SPDIF (Sony Philips Digital Interface) transmission circuit 104. The television receiver 100 further includes an antenna terminal 105, a digital broadcast tuner 106, an MPEG decoder 107, a video signal processing circuit 108, a graphic generation circuit 109, a panel drive circuit 110, and a display panel 111.

The television receiver 100 further includes an audio signal processing circuit 112, an audio amplifier circuit 113, a speaker 114, an Ethernet interface (Ethernet I/F) 115, and a network terminal 116. The television receiver 100 further includes an internal bus 120, a central processing unit (CPU) 121, a flash read-only memory (ROM) 122, an SDRAM (Synchronous RAM) 123, a display control unit 124, a remote control reception unit 125, a remote control transmitter 126, and a power supply unit 127. Note that "Ethernet" is a registered trademark.

The CPU 121 controls operation of each component of the television receiver 100. The flash ROM 122 stores control software and holds data. The SDRAM 123 constitutes a work area of the CPU 121. The CPU 121 expands the software and the data read from the flash ROM 122 on the SDRAM 123 to start the software to control each component of the television receiver 100.

The remote control reception unit 125 receives a remote control signal (remote control code) transmitted from the remote control transmitter 126 and supplies the remote control code to the CPU 121. The CPU 121 controls each component of the television receiver 100 based on the remote control code. Although the remote control unit is illustrated as a user instruction input unit in the embodiment, the user instruction input unit may have another configuration, such as a touch panel unit for inputting an instruction through approaching or touching, a gesture input unit that detects input of an instruction through a mouse, a keyboard, or a camera, and an audio input unit for inputting an instruction through sound.

The antenna terminal 105 is a terminal for inputting a television broadcast signal received by a reception antenna (not depicted). The digital broadcast tuner 106 processes the television broadcast signal input to the antenna terminal 105 and extracts a partial TS (Transport Stream) (TS packet of video data, TS packet of audio data) from a predetermined transport stream corresponding to a channel selected by a user.

The digital broadcast tuner 106 extracts PSI/SI (Program Specific Information/Service Information) from the obtained transport stream and outputs the PSI/SI to the CPU 121. The process of extracting the partial TS of an arbitrary channel from a plurality of transport streams obtained by the digital broadcast tuner 106 is enabled by obtaining information of a packet ID (PID) of the arbitrary channel from the PSI/SI (program association table/program map table (PAT/PMT)).

The MPEG decoder 107 obtains image data by applying a decoding process to a video PES (Packetized Elementary Stream) packet constituted by a TS packet of video data obtained by the digital broadcast tuner 106. The MPEG decoder 107 obtains audio data by applying a decoding process to an audio PES packet constituted by a transport stream (TS) packet of audio data obtained by the digital broadcast tuner 106. Note that similar processes are executed when the broadcast format is MPEG media transport (MMT) instead of MPEG TS.

The video signal processing circuit 108 and the graphic generation circuit 109 apply a scaling process (resolution conversion process), a superimposing process of graphics data, and the like as necessary to the image data obtained by the MPEG decoder 107 or the image data received by the HDMI reception unit 102.

The panel drive circuit 110 drives the display panel 111 based on video (image) data output from the graphic generation circuit 109. The display control unit 124 controls the graphics generation circuit 109 and the panel drive circuit 110 to control the display in the display panel 111. The display panel 111 is constituted by, for example, an LCD (Liquid Crystal Display), a PDP (Plasma Display Panel), or an organic EL panel (Organic Electro-Luminescence Panel).

Although the display control unit 124 is included in addition to the CPU 121 in the example illustrated in the embodiment, the CPU 121 may directly control the display in the display panel 111. The CPU 121 and the display control unit 124 may be provided by one chip or may be provided by a plurality of cores. The power supply unit 127 supplies power to each component of the television receiver 100. The power supply unit 127 may be an alternating current (AC) power supply or a battery (storage battery or dry battery).

The audio signal processing circuit 112 applies necessary processing, such as digital-to-analog (D/A) conversion, to the audio data obtained by the MPEG decoder 107. The audio amplifier circuit 113 amplifies an audio signal output from the audio signal processing circuit 112 and supplies the audio signal to the speaker 114. Note that the speaker 114 may be monaural or stereo. The number of speakers 114 may be one or two or more. The speaker 114 may be earphones or headphones. The speaker 114 may be compatible with 2.1 channels, 5.1, 7.1, and 22.2 channels, and the like. The speaker 114 may be wirelessly connected to the television receiver 100. The speaker 114 may be another device.

The network terminal 116 is a terminal connected to a network and is connected to the Ethernet interface 115. The CPU 121, the flash ROM 122, the SDRAM 123, the Ethernet interface 115, and the display control unit 124 are connected to the internal bus 120.

Through communication compliant with the HDMI, the HDMI reception unit (HDMI sync) 102 receives baseband image (video) and audio data to be supplied to the HDMI terminal 101 via an HDMI cable. The high-speed bus interface 103 is an interface of a two-way communication channel constituted by using a reserve line and a hot plug detect (HPD) line constituting the HDMI cable. Details of the HDMI reception unit 102 will be described later.

The SPDIF transmission circuit 104 is a circuit for transmitting a digital audio sending signal of the standard IEC 60958 (hereinafter, referred to as "SPDIF signal" as necessary). The SPDIF transmission circuit 104 is a transmission circuit compliant with the standard IEC 60958.

In the embodiment, the SPDIF transmission circuit 104 generates an SPDIF signal including a compressed digital audio signal SA of a predetermined number of channels, such as 2 channels, 5.1 channels, 7.1 channels, and 22.2 channels. The compressed digital audio signal SA is, for example, an MPEG-4 AAC compressed digital audio signal acquired by the digital broadcast tuner 106 from a broadcast signal, that is, a digital audio signal before the execution of the decoding process by the MPEG decoder 107.

In the embodiment, the SPDIF transmission circuit 104 adds first, second, and third metadata to the compressed digital audio signal SA. Here, the first metadata is metadata indicating a sending frequency of the compressed digital audio signal. The second metadata is metadata indicating a sampling frequency used to convert an uncompressed digital audio signal of each channel into an analog signal. The third metadata is metadata indicating a ratio of the sending frequency to the sampling frequency. Details of the SPDIF signal will be described later.

The high-speed bus interface 103 is inserted between the Ethernet interface 115 and the HDMI terminal 101. The high-speed bus interface 103 supplies reception data, which is received from a device of the other party through the HDMI terminal 101 via an HDMI cable, to the CPU 121 through the Ethernet interface 115.

The high-speed bus interface 103 also transmits transmission data, which is supplied from the CPU 121 through the Ethernet interface 115, from the HDMI terminal 101 to the device of the other party through the HDMI cable. The high-speed bus interface 103 also transmits the SPDIF signal generated by the SPDIF transmission circuit 104 from the HDMI terminal 101 to the device of the other party through the HDMI cable. Details of the high-speed bus interface 103 will be described later.

Note that when, for example, the received content data is to be sent out to the network, the content data is output to the network terminal 116 through the Ethernet interface 115. Similarly, when the received content data is to be sent out to the two-way communication channel of the HDMI cable, the content data is output to the HDMI terminal 101 through the Ethernet interface 115 and the high-speed bus interface 103. Here, before the image data is output, a copyright protection technique, such as high-bandwidth digital content protection (HDCP), digital transmission content protection (DTCP), and DTCP+, may be used to encrypt the image data and send the image data.

An operation of the television receiver 100 depicted in FIG. 2 will be simply described. The television broadcast signal input to the antenna terminal 105 is supplied to the digital broadcast tuner 106. The digital broadcast tuner 106 processes the television broadcast signal and outputs a predetermined transport stream corresponding to the channel selected by the user. The partial TS (TS packet of video data, TS packet of audio data) is extracted from the transport stream, and the partial TS is supplied to the MPEG decoder 107. If the television broadcast signal is in the MMT format, the audio data is in the LATM/LOAS format.

The MPEG decoder 107 applies a decoding process to the video PES packet constituted by the TS packet of the video data to obtain the video data. The video signal processing circuit 108 and the graphic generation circuit 109 apply a scaling process (resolution conversion process), a superimposing process of graphics data, and the like to the video data as necessary, and the video data is then supplied to the panel drive circuit 110. Therefore, an image corresponding to the channel selected by the user is displayed on the display panel 111.

The MPEG decoder 107 applies a decoding process to the audio PES packet constituted by the TS packet of the audio data to obtain the audio data. The audio signal processing circuit 112 applies necessary processing, such as D/A conversion, to the audio data, and the audio amplifier circuit 113 further amplifies the audio data. The audio data is then supplied to the speaker 114. Therefore, sound corresponding to the channel selected by the user is output from the speaker 114. When the audio data is in the LATM/LOAS format, the decoding process is executed according to the format.

The content data (image data and audio data) supplied from the network terminal 116 to the Ethernet interface 115 or from the HDMI terminal 101 to the Ethernet interface 115 through the high-speed bus interface 103 is supplied to the MPEG decoder 107. Subsequently, the operation is similar to when the television broadcast signal is received. The image is displayed on the display panel 111, and the sound is output from the speaker 114.

The HDMI reception unit 102 acquires the image data and the audio data transmitted to the HDMI terminal 101 through the HDMI cable. The image data is supplied to the video signal processing circuit 108. The audio data is supplied to the audio signal processing circuit 112. Subsequently, the operation is similar to when the television broadcast signal is received. The image is displayed on the display panel 111, and the sound is output from the speaker 114.

The SPDIF signal (including the compressed digital audio signal SA of the predetermined number of channels) generated by the SPDIF transmission circuit 104 is supplied to the high-speed bus interface 103. The high-speed bus interface 103 transmits the SPDIF signal from the HDMI terminal 101 to the audio amplifier 200 through the HDMI cable 610.

Configuration Example of Audio Amplifier

Figure 3:
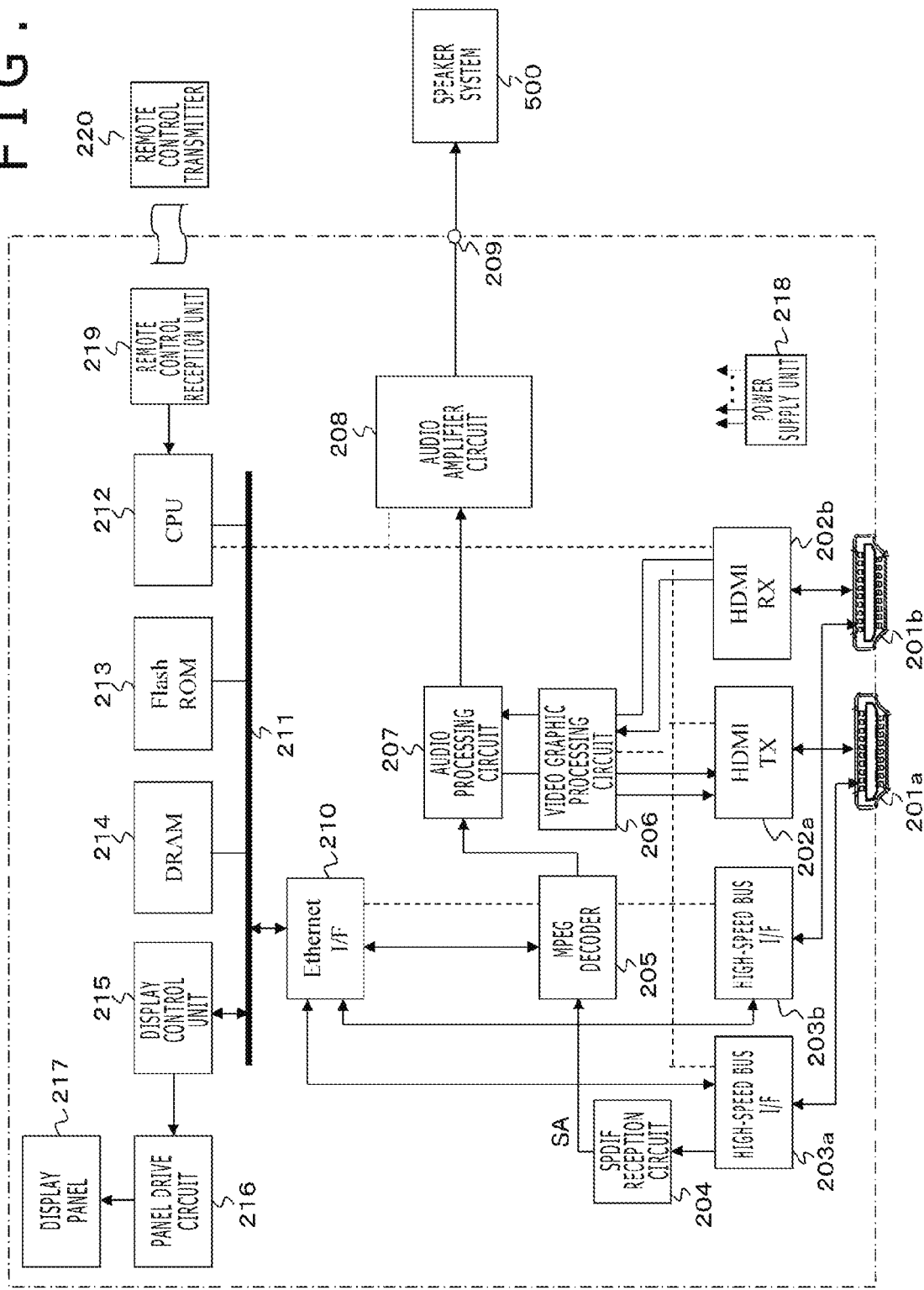
FIG. 3 is a block diagram depicting a configuration example of an audio amplifier constituting the AV system.

FIG. 3 depicts a configuration example of the audio amplifier 200. The audio amplifier 200 includes the HDMI terminals 201a and 201b, the HDMI transmission unit 202a, the HDMI reception unit 202b, the high-speed bus interfaces 203a and 203b, and an SPDIF reception circuit 204.

The audio amplifier 200 further includes an MPEG decoder 205, a video graphic processing circuit 206, an audio processing circuit 207, an audio amplifier circuit 208, and an audio output terminal 209. The audio amplifier 200 further includes an Ethernet interface 210, an internal bus 211, a CPU 212, a flash ROM 213, a dynamic random access memory (DRAM) 214, a display control unit 215, a panel drive circuit 216, a display panel 217, a power supply unit 218, a remote control reception unit 219, and a remote control transmitter 220.

The CPU 212 controls operation of each component of the audio amplifier 200. The flash ROM 213 stores control software and holds data. The DRAM 214 constitutes a work area of the CPU 212. The CPU 212 expands the software and the data read from the flash ROM 213 on the DRAM 214 to start the software to control each component of the audio amplifier 200. The CPU 212, the flash ROM 213, the DRAM 214, the Ethernet interface 210, and the display control unit 215 are connected to the internal bus 211.

The remote control reception unit 219 receives a remote control signal (remote control code) transmitted from the remote control transmitter 220 and supplies the remote control code to the CPU 212. The CPU 212 controls each component of the audio amplifier 200 based on the remote control code. Although the remote control unit is illustrated as a user instruction input unit in the embodiment, the user instruction input unit may have another configuration, such as a touch panel unit for inputting an instruction through approaching or touching, a gesture input unit that detects input of an instruction through a mouse, a keyboard, or a camera, and an audio input unit for inputting an instruction through sound.

The HDMI transmission unit (HDMI source) 202a sends out a baseband video (image) and audio data from the HDMI terminal 201a to an HDMI cable through communication compliant with the HDMI. Through the communication compliant with the HDMI, the HDMI reception unit (HDMI sync) 202b receives the baseband video (image) and the audio data supplied to the HDMI terminal 201b through the HDMI cable. Details of the HDMI transmission unit 202a and the HDMI reception unit 202b will be described later.

The high-speed bus interfaces 203a and 203b are interfaces of two-way communication using reserve lines and HPD lines constituting HDMI cables. Details of the high-speed bus interfaces 203a and 203b will be described later. The SPDIF reception circuit 204 is a circuit for receiving an SPDIF signal (digital audio signal of standard IEC 60958). The SPDIF reception circuit 204 is a reception circuit compliant with the standard IEC 60958.

In the embodiment, the SPDIF reception circuit 204 receives the SPDIF signal including the compressed digital audio signal SA of the predetermined number of channels and outputs the compressed digital audio signal SA. In the embodiment, the SPDIF reception circuit 204 extracts the first, second, and third metadata added to the compressed digital audio signal SA and sends the first, second, and third metadata to the CPU 212.

As described, the first metadata is metadata indicating the sending frequency of the compressed digital audio signal. The second metadata is metadata indicating the sampling frequency used to convert the uncompressed digital audio signal of each channel into an analog signal. The third metadata is metadata indicating the ratio of the sending frequency to the sampling frequency.

The CPU 212 controls processing by each component regarding the compressed digital audio signal SA based on the first, second, and third metadata. In this case, the CPU 212 compares a ratio of the sending frequency indicated in the first metadata to the sampling frequency indicated in the second metadata with the ratio indicated in the third metadata to detect an error in the first metadata or the second metadata.

The CPU 212 can determine that there is an error in the first metadata or the second metadata when the two ratios do not coincide and can stop the process of each component regarding the compressed digital audio signal SA (such as a decoding process, a process of converting the signal into an analog signal, and a process of clearly indicating a reproduction audio frequency band to the user). In this case, the CPU 212 can, for example, control the display panel 217 to display an "error" to notify the user that the sound cannot be output based on the compressed digital audio signal SA received by the SPDIF reception circuit 204.

The MPEG decoder 205 decodes the partial TS supplied to the Ethernet interface 210 through the high-speed bus interface 203a. In this case, the MPEG decoder 205 applies a decoding process to the audio PES packet in the partial TS to obtain an uncompressed digital audio signal of 2 channels or multiple channels.

The MPEG decoder 205 also applies a decoding process to the compressed digital audio signal SA of the predetermined number of channels obtained by the SPDIF reception circuit 204 to obtain an uncompressed digital audio signal of each channel of the 2 channels or the multiple channels.

In this case, the MPEG decoder 205 locks the PLL to the frequency according to the sending frequency indicated in the first metadata under the control of the CPU 212 and uses a clock signal of the frequency locked by the PLL to apply a decoding process to the compressed digital audio signal SA to obtain the uncompressed digital audio signal of each channel of the 2 channels or the multiple channels.

The audio processing circuit 207 applies necessary processing, such as D/A conversion, to the uncompressed digital audio signal of each channel of the 2 channels or the multiple channels obtained by the MPEG decoder 205 to obtain an analog audio signal of each channel. In this case, the audio processing circuit 207 converts the uncompressed digital audio signal of each channel, which is obtained by applying the decoding process to the compressed digital audio signal SA, into an analog signal at the sampling frequency indicated in the second metadata.

The audio amplifier circuit 208 amplifies the analog audio signal of each channel of the 2 channels or the multiple channels obtained by the audio processing circuit 207 and outputs the analog audio signal to the audio output terminal 209. Note that the speaker system 500 for 2 channels or for multiple channels is connected to the audio output terminal 209.

The audio processing circuit 207 further applies necessary processing to the audio data obtained by the HDMI reception unit 202b and then supplies the audio data to the HDMI transmission unit 202a. The video graphic processing circuit 206 applies processing, such as superimposition of graphics data, to the video (image) data obtained by the HDMI reception unit 202b and then supplies the data to the HDMI transmission unit 202a.

The display control unit 215 controls the panel drive circuit 216 to control the display in the display panel 217 in order to, for example, display a user interface or to display the status of the audio amplifier 200. The display panel 217 is constituted by, for example, an LCD (Liquid Crystal Display) or an organic EL panel (Organic Electro-Luminescence Panel).

In the embodiment, when the display panel 217 outputs sound regarding the compressed digital audio signal SA of the predetermined number of channels obtained by the SPDIF reception circuit 204, the display panel 217 displays the sampling frequency indicated in the second metadata as a sampling frequency of the output analog audio signal of each channel under the control of the display control unit 215 (CPU 212).

In this case, the display panel 217 uses the sending frequency indicated in the first metadata or the ratio indicated in the third metadata to display the sending frequency of the compressed digital audio signal SA under the control of the display control unit 215 (CPU 212).

Figure 4:
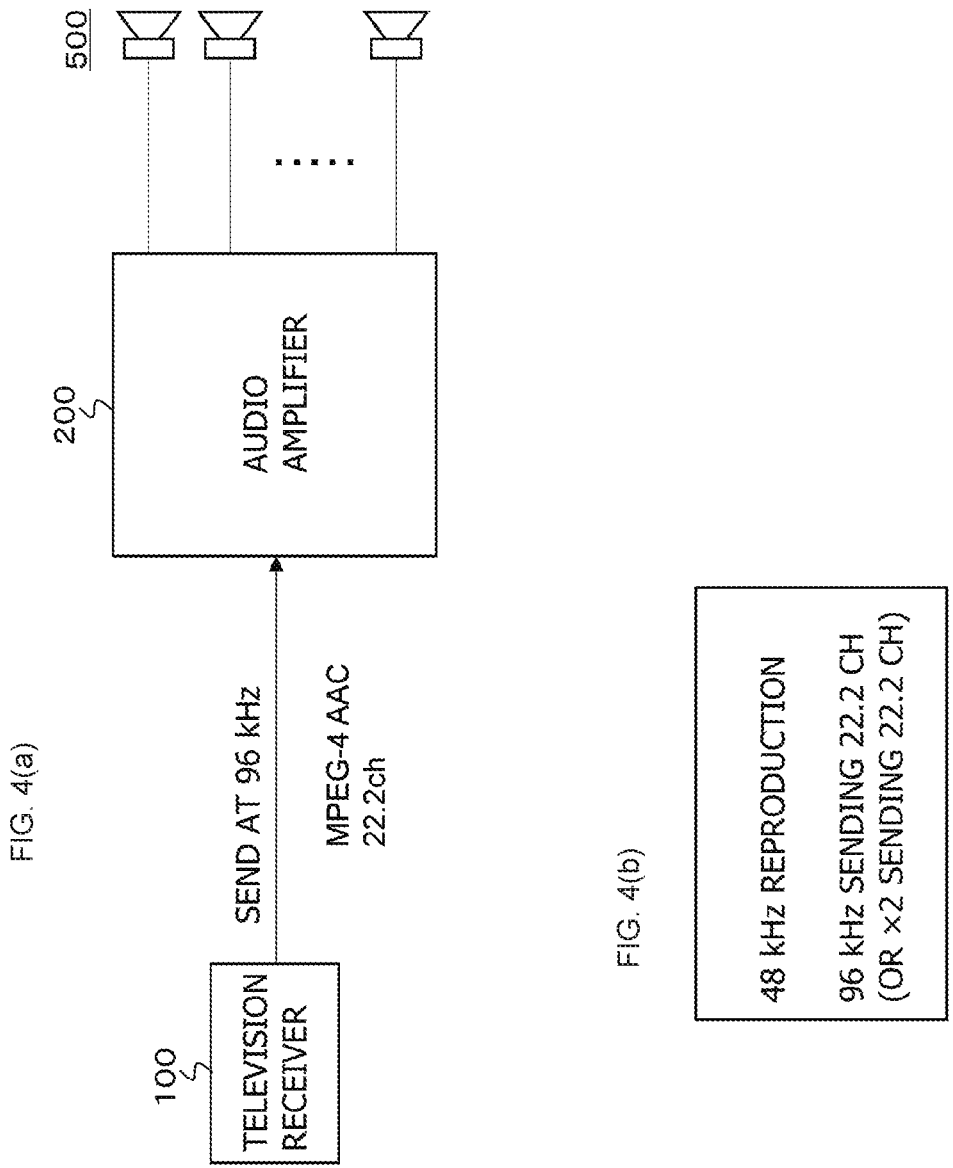

In FIG. 4(b) depicts a display example in the display panel 217. The example is an example in which the compressed digital audio signal SA of MPEG-4 AAC of the 22.2 channels with the sampling frequency of 48 kHz is sent from the television receiver 100 to the audio amplifier 200 at 96 kHz as depicted in FIG. 4(a).

The display of "48 kHz Reproduction" in FIG. 4(b) indicates the sampling frequency of the output analog audio signal of each channel. "96 kHz sending" or "×2 sending" indicates the sending frequency of the compressed digital audio signal SA. Here, the "96 kHz sending" is display using the sending frequency indicated in the first metadata, and the "×2 sending" is display using the ratio indicated in the third metadata.

Although the display control unit 215 is included in addition to the CPU 212 in the example illustrated in the embodiment, the CPU 212 may directly control the display in the display panel 217. The CPU 212 and the display control unit 215 may be provided by one chip or may be provided by a plurality of cores. The power supply unit 218 supplies power to each component of the audio amplifier 200. The power supply unit 218 may be an AC power supply or a battery (storage battery or dry battery).

An operation of the audio amplifier 200 depicted in FIG. 3 will be simply described. The HDMI reception unit 202b acquires the video (image) data and the audio data transmitted from the BD player 300 to the HDMI terminal 201b through the HDMI cable 620. The video data and the audio data are supplied to the HDMI transmission unit 202a through the video graphic processing circuit 206 and the audio processing circuit 207 and are transmitted to the television receiver 100 through the HDMI cable 610 connected to the HDMI terminal 202a.

The high-speed bus interface 203a receives the partial TS transmitted from the television receiver 100 through a predetermined line of the HDMI cable 610 connected to the HDMI terminal 201a. The partial TS is supplied to the MPEG decoder 205 through the Ethernet interface 211. The MPEG decoder 205 applies a decoding process to the PES packet of the audio data constituting the partial TS and obtains an uncompressed digital audio signal of each channel of the 2 channels or the multiple channels.

The uncompressed digital audio signal of each channel is supplied to the audio processing circuit 207, and necessary processing, such as D/A conversion, is applied. When muting is in an off-state, the analog audio signal of each channel output from the audio processing circuit 207 is amplified and output to the audio output terminal 209. Therefore, audio output of the 2 channels or the multiple channels is obtained from the speaker system 500.

The high-speed bus interface 203a receives the SPDIF signal including the compressed digital audio signal SA of the predetermined number of channels transmitted from the television receiver 100 through a predetermined line of the HDMI cable 610 connected to the HDMI terminal 201a. The SPDIF signal is supplied to the SPDIF reception circuit 204. The SPDIF reception circuit 204 processes the SPDIF signal and obtains the compressed digital audio signal SA of the predetermined number of channels.

The compressed digital audio signal SA is supplied to the MPEG decoder 205. The MPEG decoder 205 applies a decoding process to the compressed digital audio signal SA and obtains an uncompressed digital audio signal of each channel of the 2 channels or the multiple channels.

The uncompressed digital audio signal of each channel is supplied to the audio processing circuit 207, and necessary processing, such as D/A conversion is applied. When the muting is in the off-state, the analog audio signal of each channel output from the audio processing circuit 207 is amplified and output to the audio output terminal 209. Therefore, audio output of the 2 channels or the multiple channels is obtained from the speaker system 500.

As described, the partial TS received by the high-speed bus interface 203a and supplied to the Ethernet interface 210 is supplied as transmission data to the high-speed bus interface 203b. Therefore, the partial TS is transmitted to the BD player 300 through the HDMI cable 620 connected to the HDMI terminal 201b.

Configuration Example of BD Player

Figure 5:
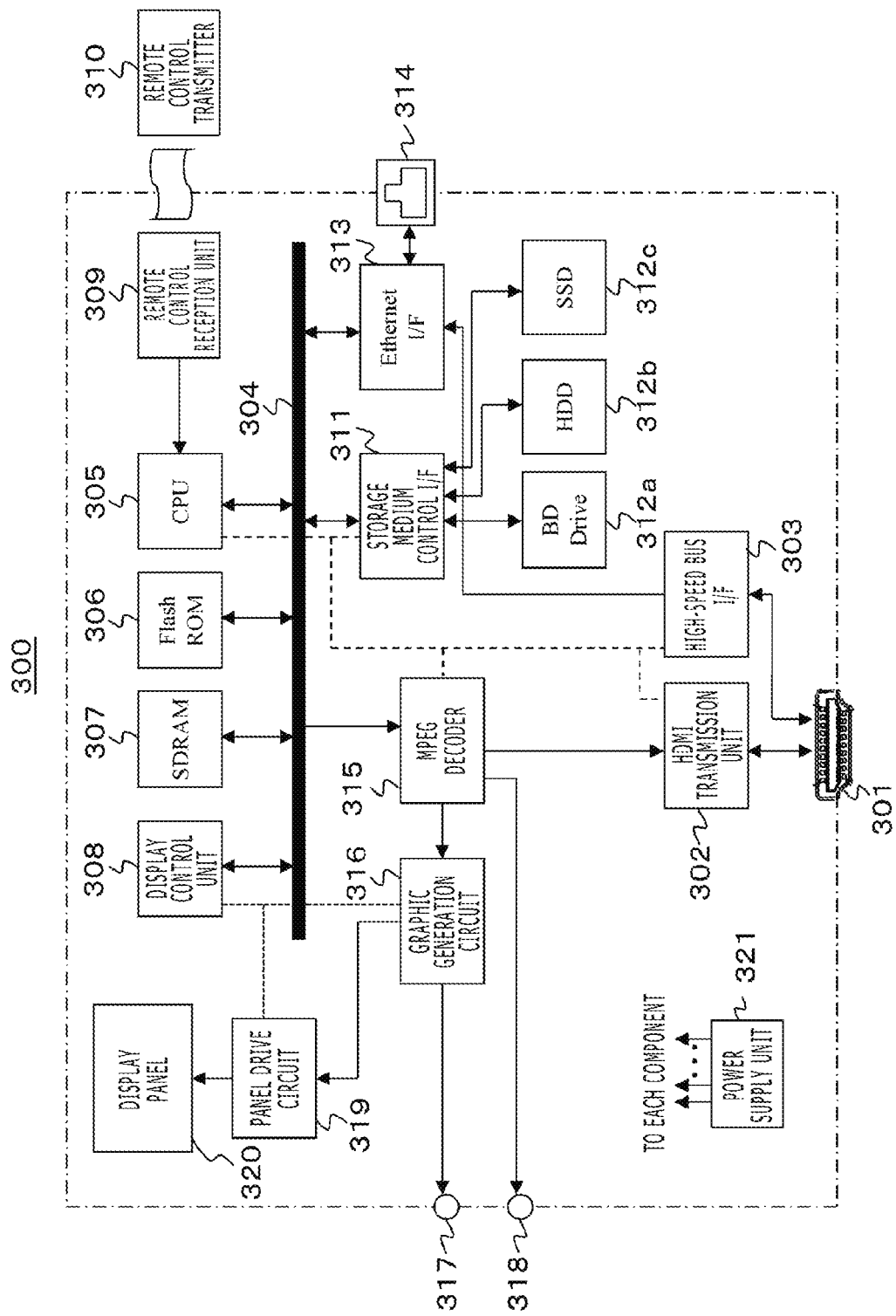
FIG. 5 is a block diagram depicting a configuration example of a Blu-ray Disc (BD) player constituting the AV system.

FIG. 5 depicts a configuration example of the BD player 300. The BD player 300 includes the HDMI terminal 301, the HDMI transmission unit 302, and the high-speed bus interface 303. The BD player 300 further includes an internal bus 304, a CPU (Central Processing Unit) 305, a flash ROM (Read Only Memory) 306, an SDRAM (Synchronous Random Access Memory) 307, a display control unit 308, a remote control reception unit 309, and a remote control transmitter 310.

The BD player 300 further includes a storage (recording) medium control interface 311, a BD (Blu-Ray Disc) drive 312a, an HDD (Hard disk drive) 312b, an SSD (Solid State Drive) 312c, an Ethernet interface (Ethernet I/F) 313, and a network terminal 314. The BD player 300 further includes an MPEG (Moving Picture Expert Group) decoder 315, a graphic generation circuit 316, a video output terminal 317, and an audio output terminal 318.

The BD player 300 further includes a panel drive circuit 319, a display panel 320, and a power supply unit 321. The CPU 305, the flash ROM 306, the SDRAM 307, the storage medium control interface 311, the Ethernet interface 313, and the MPEG decoder 315 are connected to the internal bus 304.

The CPU 305 controls operation of each component of the BD player 300. The flash ROM 306 stores control software and holds data. The SDRAM 307 constitutes a work area of the CPU 305. The CPU 305 expands the software and the data read from the flash ROM 306 on the SDRAM 307 to start the software to control each component of the BD player 300.

The remote control reception unit 309 receives a remote control signal (remote control code) transmitted from the remote control transmitter 310 and supplies the remote control code to the CPU 305. The CPU 305 controls each component of the BD player 300 according to the remote control code. Although the remote control unit is illustrated as a user instruction input unit in the embodiment, the user instruction input unit may have another configuration, such as, a switch, a wheel, a touch panel unit for inputting an instruction through approaching or touching, a gesture input unit that detects input of an instruction through a mouse, a keyboard, or a camera, and an audio input unit for inputting an instruction through sound.

The BD drive 312a records content data in a BD disc as a disc-shaped recording medium or reproduces content data from the BD disc. The HDD 312b records content data or reproduces content data. The SSD 312c records content data in a semiconductor memory, such as a memory card, or reproduces content data from the semiconductor memory.

The BD drive 312a, the HDD 312b, and the SSD 312c are connected to the internal bus 304 through the storage medium control interface 311. For example, a serial advanced technology attachment (SATA) interface is used as an interface for the BD drive 312a and the HDD 312b. For example, a SATA interface or a peripheral component interconnect express (PCIe) interface is used as an interface for the SSD 312c.

The MPEG decoder 315 applies a decoding process to an MPEG2 stream reproduced by the BD drive 312a, the HDD 312b, or the SSD 312c to obtain image and audio data. The graphic generation circuit 316 applies superimposing process of graphics data and the like as necessary to the image data obtained by the MPEG decoder 315. The video output terminal 317 outputs the image data output from the graphic generation circuit 316. The audio output terminal 318 outputs the audio data obtained by the MPEG decoder 315.

The panel drive circuit 319 drives the display panel 320 based on the video (image) data output from the graphic generation circuit 316. The display control unit 308 controls the graphics generation circuit 316 and the panel drive circuit 319 to control the display in the display panel 320. The display panel 320 is constituted by, for example, an LCD (Liquid Crystal Display) or a PDP (Plasma Display Panel) organic EL panel (Organic Electro-Luminescence Panel).

Although the display control unit 308 is included in addition to the CPU 305 in the example illustrated in the embodiment, the CPU 305 may directly control the display in the display panel 320. The CPU 305 and the display control unit 308 may be provided by one chip or may be provided by a plurality of cores. The power supply unit 321 supplies power to each component of the BD player 300. The power supply unit 321 may be an AC power supply or a battery (storage battery or dry battery).

The HDMI transmission unit (HDMI source) 302 sends out baseband image (video) and audio data from the HDMI terminal 301 through communication compliant with the HDMI. The high-speed bus interface 303 is an interface of a two-way communication channel constituted by using a reserve line and an HPD line constituting an HDMI cable. Details of the HDMI transmission unit 302 will be described later.

The high-speed bus interface 303 is inserted between the Ethernet interface 313 and the HDMI terminal 301. The high-speed bus interface 303 transmits transmission data supplied from the CPU 305, from the HDMI terminal 301 to the device of the other party through the HDMI cable. The high-speed bus interface 303 supplies reception data, which is received from the device of the other party through the HDMI terminal 301 via the HDMI cable, to the CPU 305. Details of the high-speed bus interface 303 will be described later.

An operation of the BD player 300 depicted in FIG. 5 will be simply described. During recording, content data to be recorded is acquired through a digital broadcast tuner not depicted, from the network terminal 314 through the Ethernet interface 311, or from the HDMI terminal 301 through the high-speed bus interface 303. The content data is input to the storage medium control interface 311. The content data is recorded in the BD disc by the BD drive 312a, recorded in the HDD 312b, or recorded in the semiconductor memory by the SSD 312c.

During the reproduction, the content data (MPEG stream) reproduced by the BD drive 312a, the HDD 312b, or the SSD 312c is supplied to the MPEG decoder 315 through the storage medium control interface 311. The MPEG decoder 315 applies a decoding process to the reproduced content data to obtain baseband image and audio data. The image data is output to the video output terminal 317 through the graphic generation circuit 316. The audio data is output to the audio output terminal 318.

During the reproduction, the image data obtained by the MPEG decoder 315 is supplied to the panel drive circuit 319 through the graphic generation circuit 316 according to user operation, and a reproduced image is displayed on the display panel 320. The audio data obtained by the MPEG decoder 315 is supplied to a speaker not depicted according to user operation, and sound corresponding to the reproduced image is output.

When the image and audio data obtained by the MPEG decoder 315 is to be transmitted through the TMDS channel of the HDMI during the reproduction, the image and audio data is supplied to the HDMI transmission unit 302 and packed, and the image and audio data is output from the HDMI transmission unit 302 to the HDMI terminal 301.

When the content data reproduced by the BD drive 312a, the HDD 312b, or the SSD 312c is to be sent to the network during the reproduction, the content data is output to the network terminal 314 through the Ethernet interface 313. Similarly, when the content data reproduced by the BD drive 312a, the HDD 312b, or the SSD 312c is to be sent to the two-way communication channel of the HDMI cable 620 during the reproduction, the content data is output to the HDMI terminal 301 through the high-speed bus interface 303. Here, before the image data is output, a copyright protection technique, such as HDCP, DTCP, and DTCP+, may be used to encrypt the image data and send the image data.

Configuration Example of HDMI Transmission Unit/Reception Unit

Figure 6:
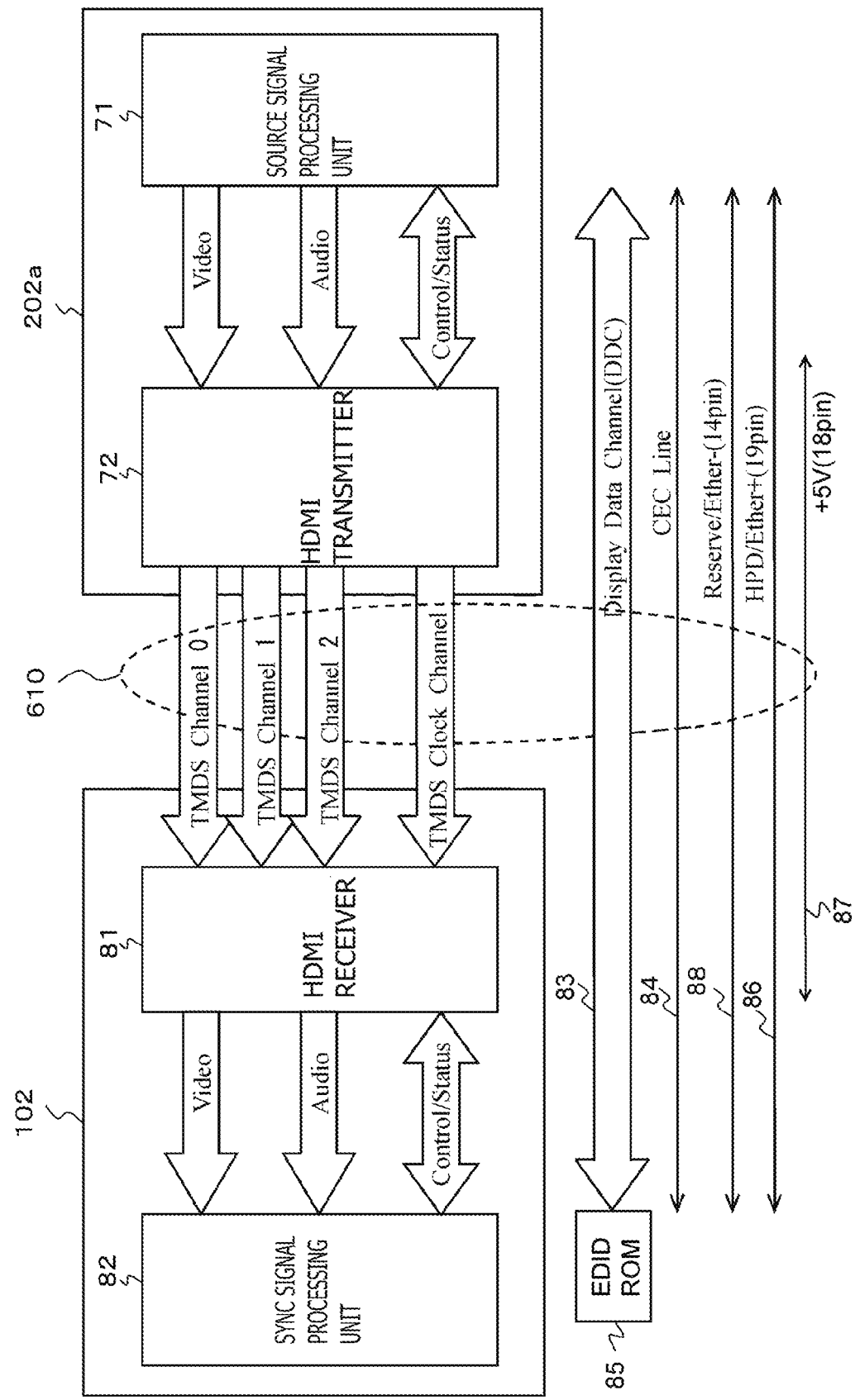
FIG. 6 is a block diagram depicting a configuration example of HDMI reception unit of the television receiver and an HDMI transmission unit of the audio amplifier.

FIG. 6 depicts a configuration example of the HDMI reception unit 102 of the television receiver 100 and the HDMI transmission unit 202a of the audio amplifier 200 in the AV system 10 of FIG. 1. A configuration example of the HDMI reception unit 202b of the audio amplifier 200 and the HDMI transmission unit 302 of the BD player 300 will not be described, because the configurations are similar.

In an effective image section (hereinafter, referred to as "active video section" as necessary) that is a section excluding a horizontal blanking period and a vertical blanking period from a section from one vertical synchronization signal to the next vertical synchronization signal (hereinafter, referred to as "video field" as necessary), the HDMI transmission unit 202a transmits differential signals of baseband (uncompressed) image data for one screen to the HDMI reception unit 102 in one direction through a plurality of channels. In the horizontal blanking period and the vertical blanking period, the HDMI transmission unit 202a transmits differential signals corresponding to audio data, a control packet (Control Packet), other auxiliary data, and the like associated with the image data to the HDMI reception unit 102 in one direction through a plurality of channels.

The HDMI transmission unit 202a includes a source signal processing unit 71 and an HDMI transmitter 72. Baseband uncompressed image (Video) and audio (Audio) data is supplied to the source signal processing unit 71. The source signal processing unit 71 applies necessary processing to the supplied image and audio data and supplies the data to the HDMI transmitter 72. The source signal processing unit 71 also exchanges information for control, information for notifying the status (Control/Status), and the like with the HDMI transmitter 72 as necessary.

The HDMI transmitter 72 converts the image data supplied from the source signal processing unit 71 into corresponding differential signals and transmits the differential signals in one direction to the HDMI reception unit 102 connected through the HDMI cable 610, via three TMDS channels #0, #1, and #2 that are a plurality of channels.

The transmitter 72 further converts the audio data, the control packet, and the other auxiliary data as well as the control data, such as a vertical synchronization signal (VSYNC) and a horizontal synchronization signal (HSYNC), associated with the uncompressed image data supplied from the source signal processing unit 71 into corresponding differential signals and transmits the differential signals in one direction to the HDMI reception unit 102 connected through the HDMI cable 610 via the three TMDS channels #0, #1, and #2.

The transmitter 72 also transmits, via a TMDS clock channel, a pixel clock synchronized with the image data transmitted through the three TMDS channels #0, #1, and #2 to the HDMI reception unit 102 connected through the HDMI cable 610.

In the active video section, the HDMI reception unit 102 receives the differential signals corresponding to the image data transmitted in one direction from the HDMI transmission unit 202a through the plurality of channels. In the horizontal blanking period and the vertical blanking period, the HDMI reception unit 102 receives the differential signals corresponding to the auxiliary data and the control data transmitted from the HDMI transmission unit 202a through the plurality of channels.

The HDMI reception unit 102 includes an HDMI receiver 81 and a sync signal processing unit 82. The HDMI receiver 81 receives, through the TMDS channels #0, #1, and #2, the differential signals corresponding to the image data and the differential signals corresponding to the auxiliary data and the control data transmitted in one direction from the HDMI transmission unit 202a connected through the HDMI cable 610, in synchronization with the pixel clock similarly transmitted from the HDMI transmission unit 202a through the TMDS clock channel. The HDMI receiver 81 further converts the differential signals into corresponding image data, auxiliary data, and control data and supplies the data to the sync signal processing unit 82 as necessary.

The sync signal processing unit 82 applies necessary processing to the data supplied from the HDMI receiver 81 and outputs the data. In addition, the sync signal processing unit 82 exchanges information for control, information for notifying the status (Control/Status), and the like with the HDMI receiver 81 as necessary.

Sending channels of the HDMI include the three TMDS channels #0, #1, and #2 for serially sending the image data, the auxiliary data, and the control data in one direction from the HDMI transmission unit 202a to the HDMI reception unit 102 in synchronization with the pixel clock and the TMDS clock channel as a sending channel for sending the pixel clock and further includes sending channels called a DDC (Display Data Channel) 83 and a consumer electronics control (CEC) line 84.

The DDC 83 includes two lines (signal lines) not depicted included in the HDMI cable 610 and is used by the source device to read an E-EDID (Enhanced-Extended Display Identification) from the sync device connected through the HDMI cable 610. That is, the sync device includes an EDIDROM 85. The source device reads, through the DDC 83, the E-EDID stored in the EDIDROM 85 from the sync device connected through the HDMI cable 610 to set the sync device and recognize the performance based on the E-EDID.

The CEC line 84 includes one line not depicted included in the HDMI cable 610 and is used for two-way communication of the data for control between the source device and the sync device.

The HDMI cable 610 further includes a line 86 connected to a pin called HPD (Hot Plug Detect). The source device can use the line 86 to detect the connection of the sync device. The HDMI cable 610 further includes a line 87 used for supplying power from the source device to the sync device. The HDMI cable 610 further includes a reserve line 88.

Figure 7:
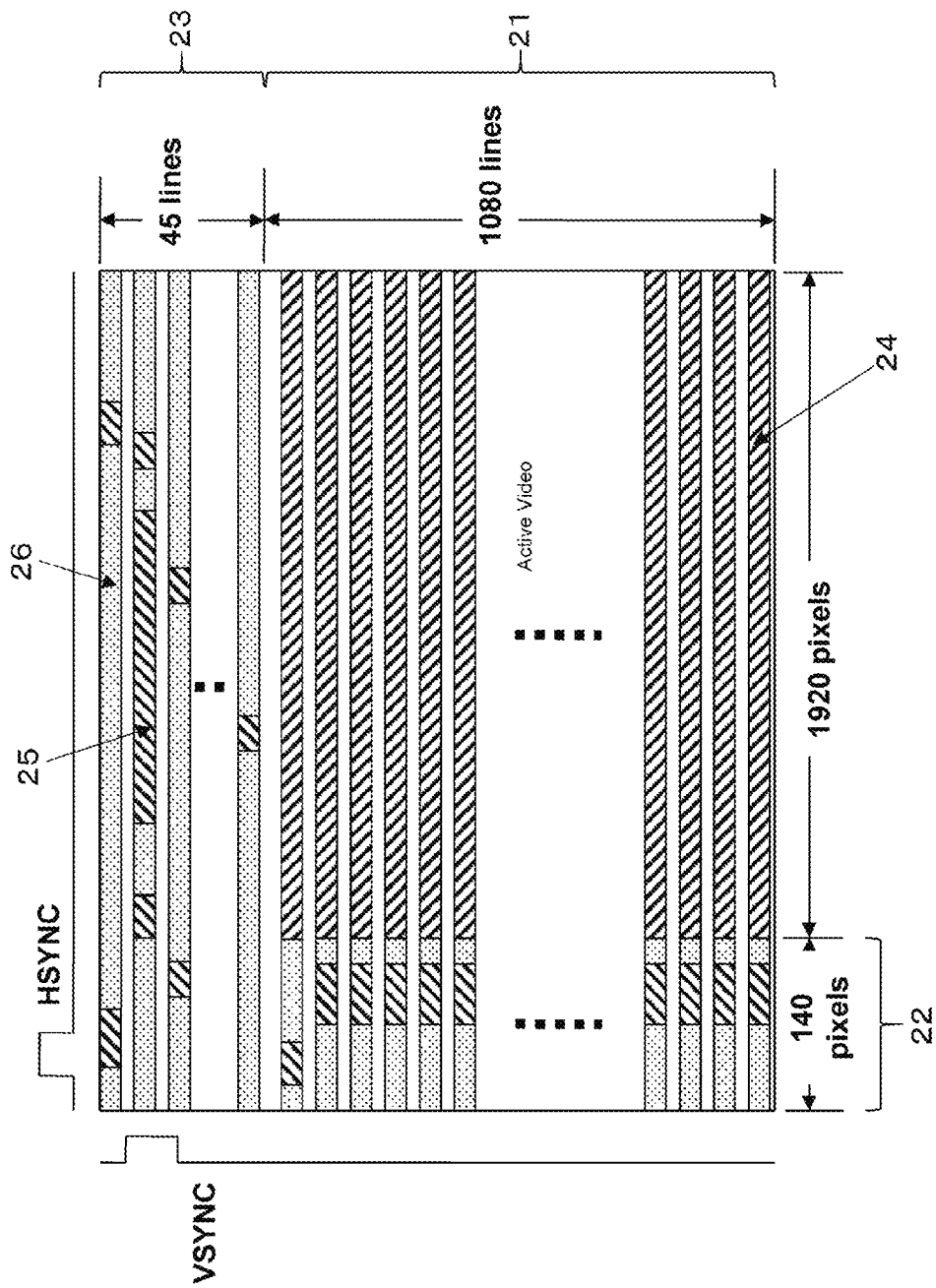
FIG. 7 is a diagram depicting sections of various types of sending data when image data in which the width height is 1920 pixels 1080 lines is sent in a transition minimized differential signaling (TMDS) channel.

FIG. 7 depicts sections of various types of sending data when image data in which the width height is 1920 pixels× 1080 lines is sent in the TMDS channel. A video field (Video Field) for sending the sending data in the three TMDS channels of the HDMI includes three types of sections according to the type of sending data: a video data section 24 (Video Data Period), a data island section 25 (Data Island Period), and a control section 26 (Control Period).

Here, the video field section is a section from a rising edge (Active Edge) of one vertical synchronization signal to a rising edge of the next vertical synchronization signal and is divided into a horizontal blanking period 22 (Horizontal Blanking), a vertical blanking period 23 (Vertical Blanking), and an effective pixel section 21 (Active Video) that is a section excluding the horizontal blanking period and the vertical blanking period from the video field section.

The video data section 24 is allocated to the effective pixel section 21. In the video data section 24, data of effective pixels (Active Pixels) for 1920 pixels×1080 lines constituting uncompressed image data of one screen is sent. The data island section 25 and the control section 26 are allocated to the horizontal blanking period 22 and the vertical blanking period 23. The auxiliary data (Auxiliary Data) is sent in the data island section 25 and the control section 26.

More specifically, the data island section 25 is allocated to part of the horizontal blanking period 22 and the vertical blanking period 23. In the data island section 25, data not related to the control in the auxiliary data, such as a packet of audio data, is sent. The control section 26 is allocated to another part of the horizontal blanking period 22 and the vertical blanking period 23. In the control section 26, data related to the control in the auxiliary data, such as a vertical synchronization signal, a horizontal synchronization signal, and a control packet, is sent.

FIG. 8 depicts a pinout of the HDMI connector. The pinout is an example of type A (type-A). Two lines that are differential lines for sending TMDS Data #i+ and TMDS Data #i− that are differential signals of a TMDS channel #i are connected to pins for TMDS Data #i+ (pins with pin numbers 1, 4, and 7) and pins for TMDS Data #i− (pins with pin numbers 3, 6, and 9).

The CEC line 84 for sending a CEC signal that is data for control is connected to a pin with pin number 13, and a pin with pin number 14 is a reserved (Reserved) pin. A line for sending an SDA (Serial Data) signal, such as E-EDID, is connected to a pin with pin number 16, and a line for sending an SCL (Serial Clock) signal that is a clock signal used for synchronization during the transmission and reception of the SDA signal is connected to a pin with pin number 15. The DDC 83 is constituted by the line for sending the SDA signal and the line for sending the SCL signal.

The HPD line 86 for the source device to detect the connection of the sync device as described above is connected to a pin with pin number 19. The power line 87 for supplying power as described above is connected to a pin with pin number 18.

Configuration Example of High-Speed Bus Interface

Figure 9:
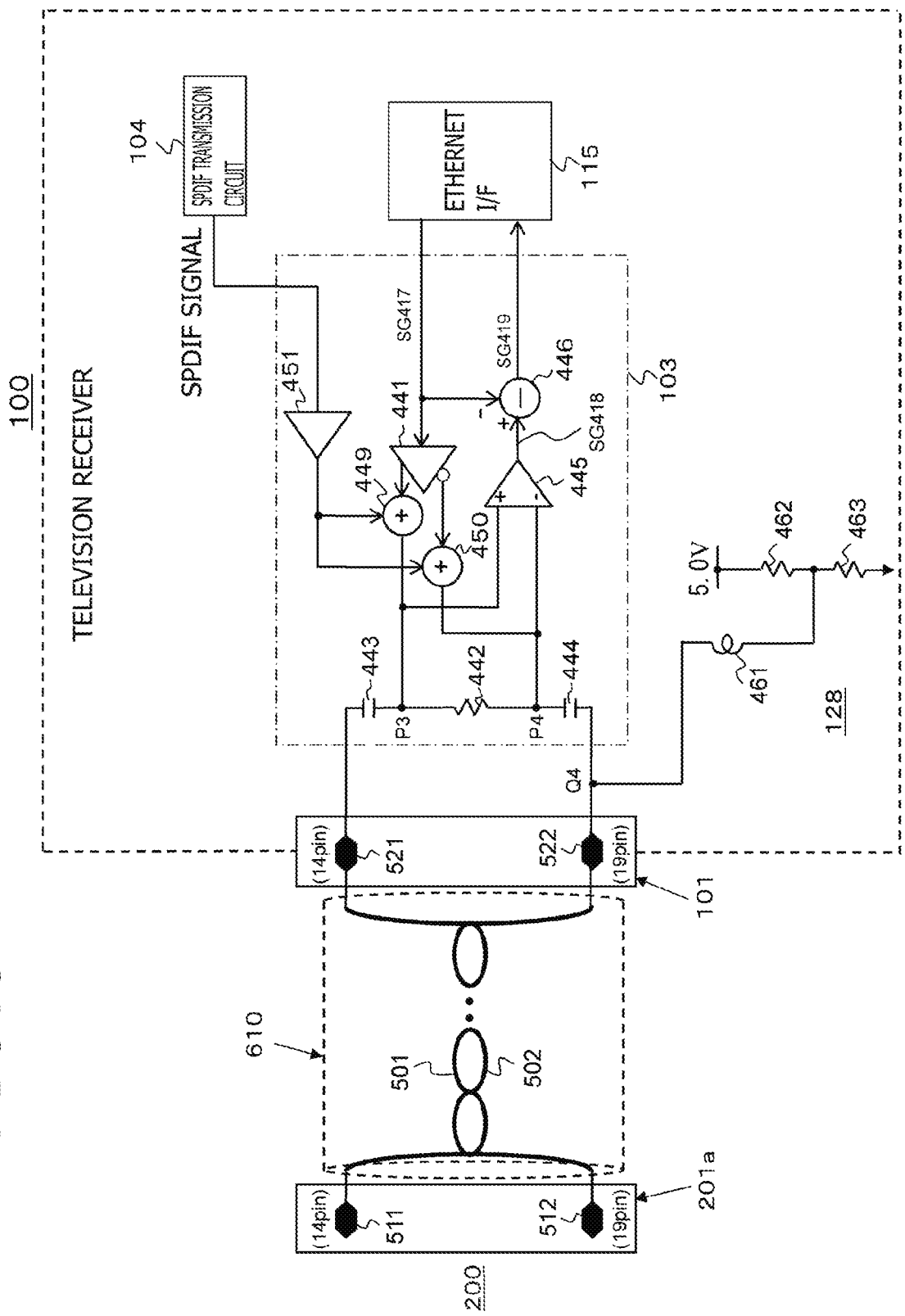
FIG. 9 is a diagram depicting a configuration example of a high-speed bus interface of the television receiver.

FIG. 9 depicts a configuration example of the high-speed bus interface 103 of the television receiver 100 in the AV system 10 of FIG. 1. The Ethernet interface 115 uses a sending path constituted by a pair of reserve line and HPD line among the plurality of lines constituting the HDMI cable 610 to perform LAN (Local Area Network) communication, that is, transmission and reception of the Ethernet signal. The SPDIF transmission circuit 104 uses the sending path constituted by the pair of lines to transmit the SPDIF signal.

The television receiver 100 includes a LAN signal transmission circuit 441, a terminator 442, AC coupling capacitances 443 and 444, a LAN signal reception circuit 445, a subtraction circuit 446, addition circuits 449 and 450, and an amplifier 451. These components constitute the high-speed bus interface 103. The television receiver 100 further includes a choke coil 461, a resistor 462, and a resistor 463 constituting a plug connection transfer circuit 128.

A series circuit of the AC coupling capacitance 443, the terminator 442, and the AC coupling capacitance 444 is connected between a 14-pin terminal 521 and a 19-pin terminal 522 of the HDMI terminal 101. A series circuit of the resistor 462 and the resistor 463 is connected between a power line (+5.0 V) and a ground line. A connection point of the resistor 462 and the resistor 463 is connected to a connection point Q4 of the 19-pin terminal 522 and the AC coupling capacitance 444 through the choke coil 461.

A connection point P3 of the AC coupling capacitance 443 and the terminator 442 is connected to an output side of the addition circuit 449 and connected to a positive input side of the LAN signal reception circuit 445. A connection point P4 of the AC coupling capacitance 444 and the terminator 442 is connected to an output side of the addition circuit 450 and connected to a negative input side of the LAN signal reception circuit 445.

One input side of the addition circuit 449 is connected to a positive output side of the LAN signal transmission circuit 441, and the SPDIF signal output from the SPDIF transmission circuit 104 is supplied to the other input side of the addition circuit 449 through the amplifier 451. One input side of the addition circuit 450 is connected to a negative output side of the LAN signal transmission circuit 441, and the SPDIF signal output from the SPDIF transmission circuit 104 is supplied to the other input side of the addition circuit 450 through the amplifier 451.

A transmission signal (transmission data) SG417 is supplied from the Ethernet interface 115 to an input side of the LAN signal transmission circuit 441. An output signal SG418 of the LAN signal reception circuit 445 is supplied to a positive terminal of the subtraction circuit 446, and the transmission signal SG417 is supplied to a negative terminal of the subtraction circuit 446. The subtraction circuit 446 subtracts the transmission signal SG417 from the output signal SG418 of the LAN signal reception circuit 445 to obtain a reception signal (reception data) SG419. The reception signal SG419 is a LAN signal (Ethernet signal) when the LAN signal is transmitted as a differential signal through the reserve line and the HPD line. The reception signal SG419 is supplied to the Ethernet interface 115.

Figure 10:
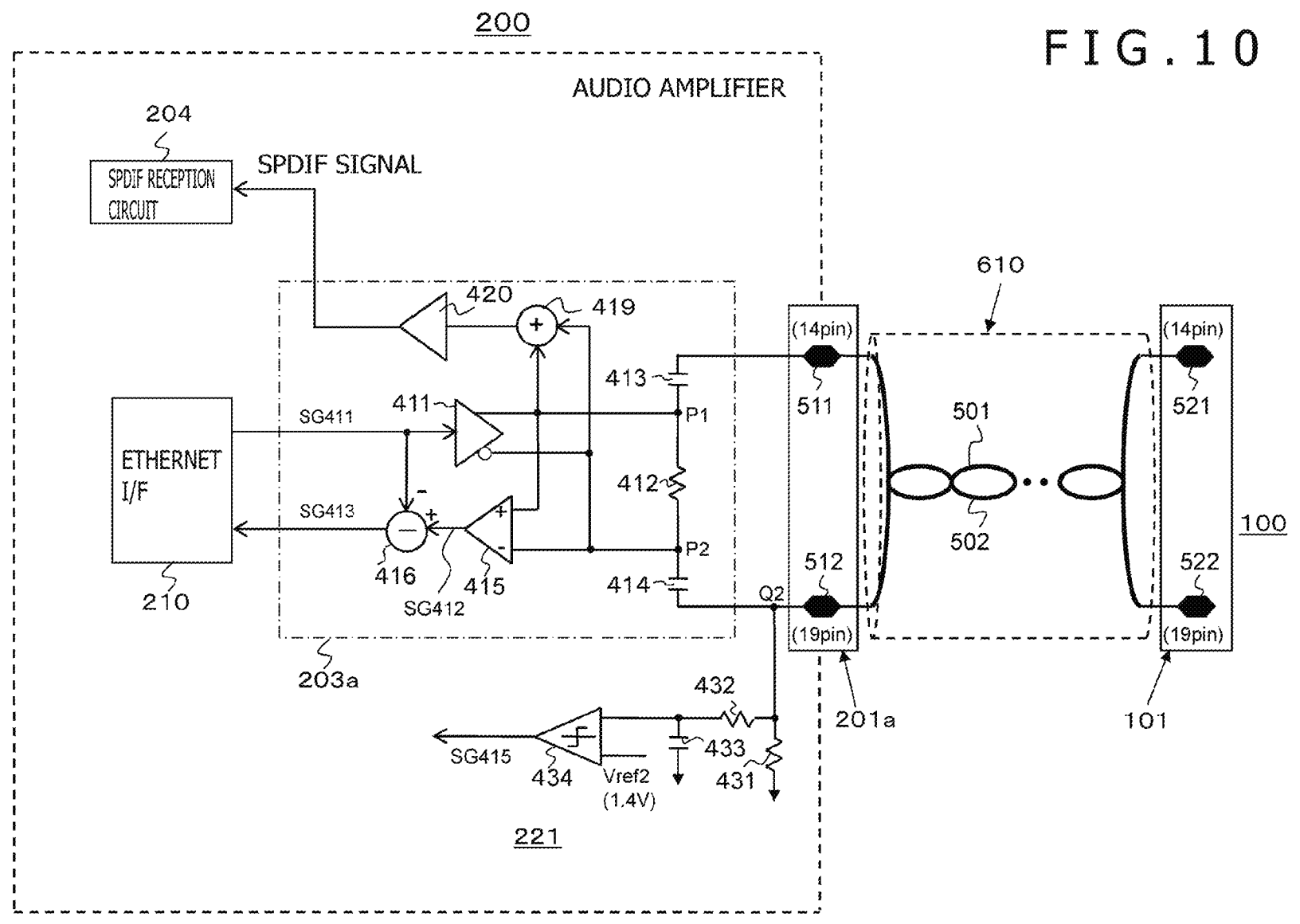

FIG. 10 depicts a configuration example of the high-speed bus interface 203*a* of the audio amplifier 200 in the AV system 10 of FIG. 1. The Ethernet interface 210 uses a sending path constituted by a pair of reserve line and HPD line among the plurality of lines constituting the HDMI cable 610 to perform LAN (Local Area Network) communication, that is, transmission and reception of an Ethernet signal. The SPDIF reception circuit 204 uses the sending path constituted by the pair of lines to receive the SPDIF signal.

The audio amplifier 200 includes a LAN signal transmission circuit 411, a terminator 412, AC coupling capacitances 413 and 414, a LAN signal reception circuit 415, a subtraction circuit 416, an addition circuit 419, and an amplifier 420. These components constitute the high-speed bus interface 203*a*. The audio amplifier 200 further includes a pull-down resistor 431, a resistor 432, a capacitance 433, and a comparator 434 constituting a plug connection detection circuit 221. Here, the resistor 432 and the capacitance 433 constitute a low-pass filter.

A series circuit of the AC coupling capacitance 413, the terminator 412, and the AC coupling capacitance 414 is connected between a 14-pin terminal 511 and a 19-pin terminal 512 of the HDMI terminal 201*a*. A connection point P1 of the AC coupling capacitance 413 and the terminator 412 is connected to a positive output side of the LAN signal transmission circuit 411 and connected to a positive input side of the LAN signal reception circuit 415.

A connection point P2 of the AC coupling capacitance 414 and the terminator 412 is connected to a negative output side of the LAN signal transmission circuit 411 and connected to a negative input side of the LAN signal reception circuit 415. A transmission signal (transmission data) SG411 is supplied from the Ethernet interface 210 to an input side of the LAN signal transmission circuit 411.

An output signal SG412 of the LAN signal reception circuit 415 is supplied to a positive terminal of the subtraction circuit 416, and the transmission signal (transmission data) SG411 is supplied to a negative terminal of the subtraction circuit 416. The subtraction circuit 416 subtracts the transmission signal SG411 from the output signal SG412 of the LAN signal reception circuit 415 to obtain a reception signal SG413. The reception signal SG413 is a LAN signal (Ethernet signal) when the LAN signal is transmitted as a differential signal through the reserve line and the HPD line. The reception signal SG413 is supplied to the Ethernet interface 210.

A connection point Q2 of the AC coupling capacitance 414 and the 19-pin terminal 512 is connected to a ground line through the pull-down resistor 431 and connected to a ground line through a series circuit of the resistor 432 and the capacitance 433. An output signal of the low-pass filter obtained at a connection point of the resistor 432 and the capacitance 433 is supplied to one input terminal of the comparator 434. The comparator 434 compares the output signal of the low-pass filter with a reference voltage Vref2 (+1.4 V) supplied to the other input terminal. An output signal SG415 of the comparator 434 is supplied to a control unit (CPU) not depicted of the audio amplifier 200.

The connection point P1 of the AC coupling capacitance 413 and the terminator 412 is connected to one input terminal of the addition circuit 419. The connection point P2 of the AC coupling capacitance 414 and the terminator 412 is connected to the other input terminal of the addition circuit 419. An output signal of the addition circuit 419 is supplied to the SPDIF reception circuit 115 through the amplifier 420. The output signal of the addition circuit 419 is an SPDIF signal when the SPDIF signal is transmitted as an in-phase signal through the reserve line and the HPD line.

Although the details will not be described, the high-speed bus interface 203*b* of the audio amplifier 200 has a similar configuration, wherein the part regarding the SPDIF signal is removed from the high-speed bus interface 103 depicted in FIG. 9. Although the details will not be described, the high-speed bus interface 303 of the BD player 300 has a similar configuration, wherein the part regarding the SPDIF signal is removed from the high-speed bus interface 203a depicted in FIG. 10.

Details of SPDIF Signal

Figure 11:
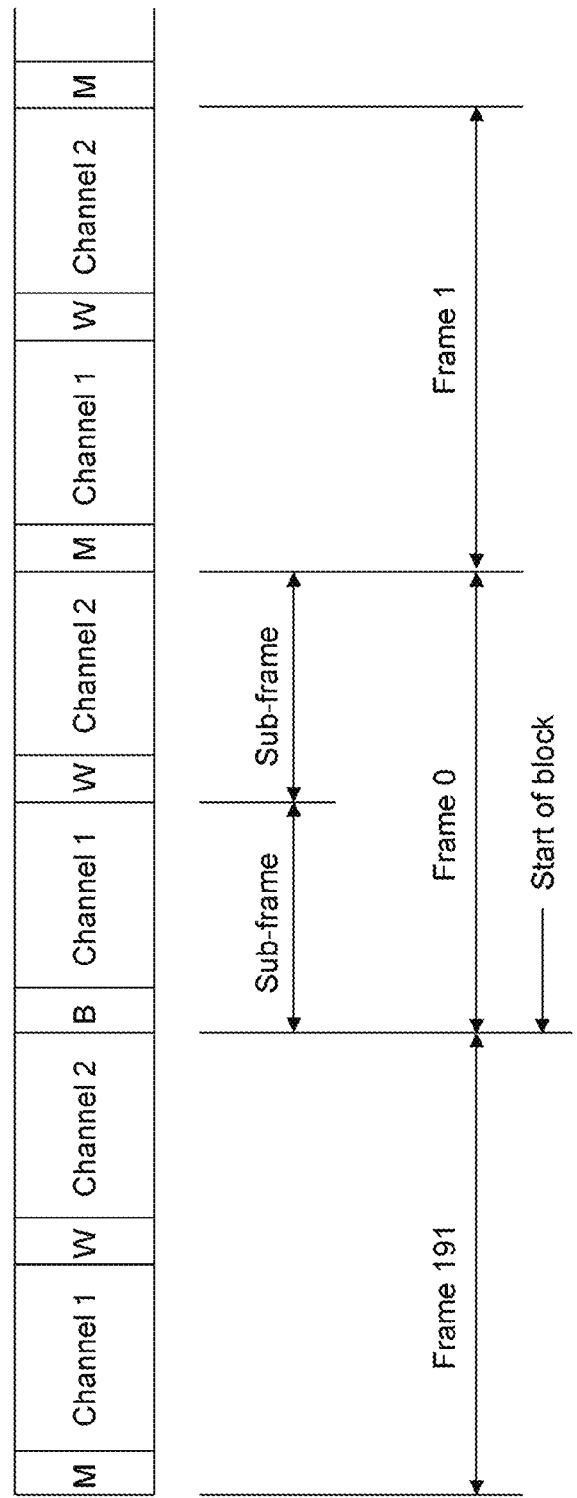
FIG. 11 is a diagram depicting a frame configuration based on the standard IEC 60958.

First, an outline of the standard IEC 60958 will be described. FIG. 11 depicts a frame configuration based on the standard IEC 60958. Each frame is constituted by two sub-frames. In the case of 2 channel stereo audio, a first frame includes a left channel signal, and a second sub-frame includes a right channel signal.

A preamble is set to a head of the sub-frame as described later. The left channel signal is provided with a preamble "M," and the right channel signal is provided with a preamble "W." However, for every 192 frames, "B" indicating the start of the block is provided for the preamble of the head. Therefore, one block is constituted by 192 frames. The block is a unit constituting the channel status described later.

Figure 12:
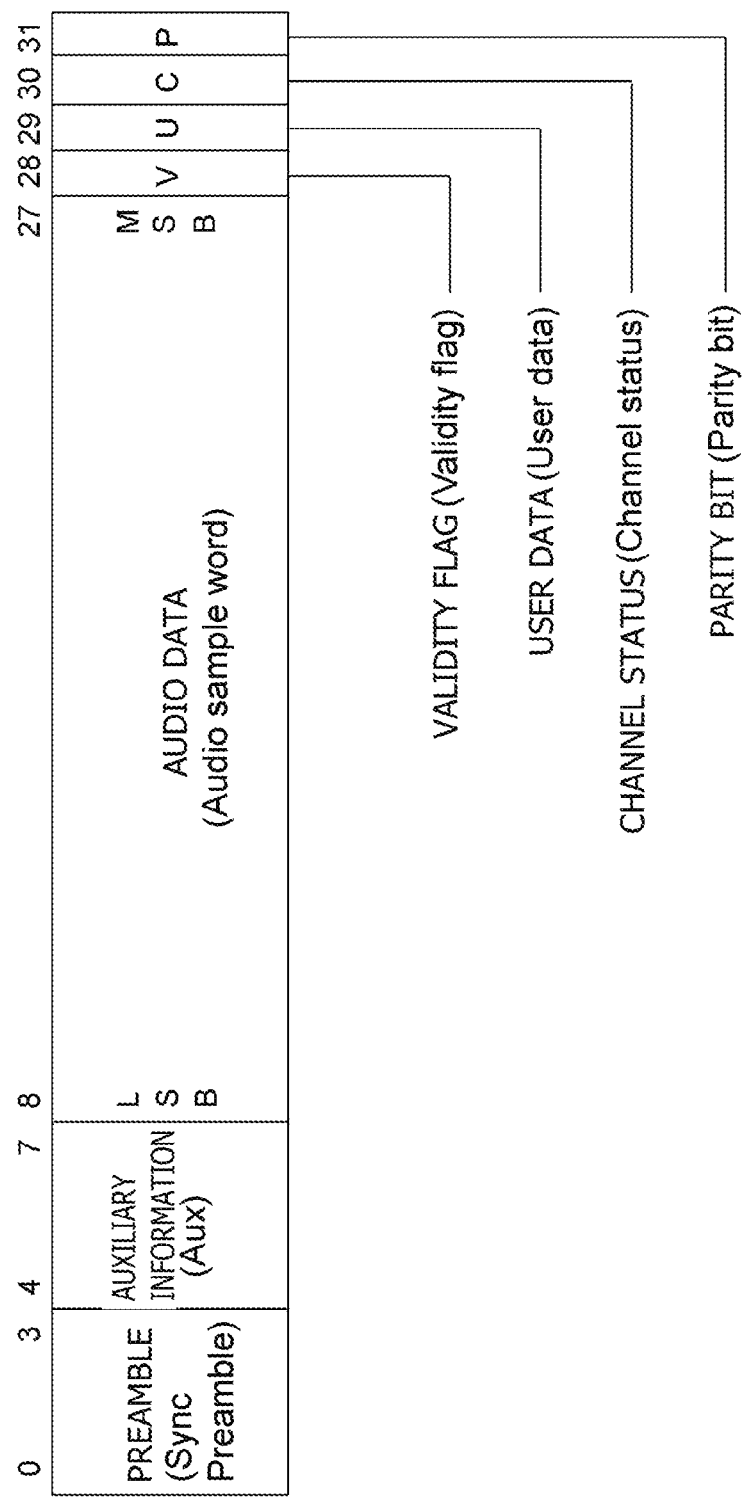
FIG. 12 is a diagram depicting a sub-frame configuration based on the standard IEC 60958.

FIG. 12 depicts a sub-frame configuration based on the standard IEC 60958. The sub-frame is constituted by 0th to 31st time slots, 32 time slots in total. The 0th to 3rd time slots indicate the preamble (Sync preamble). The preamble indicates one of "M," "W," and "B" to distinguish the left and right channels or to indicate the start position of the block as described above.

The 4th to 27th time slots provide a main data field, and the entire field indicates audio data when a 24-bit code range is adopted. The 8th to 27th time slots indicate audio data (Audio sample word) when a 20-bit code range is adopted. In the latter case, the 4th to 7th time slots can be used as auxiliary information (Auxiliary sample bits). The illustrated example indicates the latter case.

The 28th time slot provides a validity flag (Validity flag) of the main data field. The 29th time slot indicates 1 bit of user data (User data). The 29th time slots can be accumulated across the frames to constitute a series of user data. A message of the user data is constituted in 8-bit information units (IU: Information Unit), and one message includes 3 to 129 information units.

"0" of 0 to 8 bits can exist between the information units. A head of the information unit is identified by a start bit "1." First seven information units in the message are reserved, and the user can set arbitrary information in eighth and subsequent information units. The messages are divided by "0" of 8 or more bits.

The 30th time slot indicates 1 bit of channel status (Channel status). The 30th time slots can be accumulated across the frames in each block to constitute a series of channel status. Note that the head position of the block is indicated by the preamble "B" (0th to 3rd time slots) as described above.

The 31st time slot provides a parity bit (Parity bit). The parity bit is provided to make the numbers of "0" and "1" included in the 4th to 31st time slots even.

Figure 13:
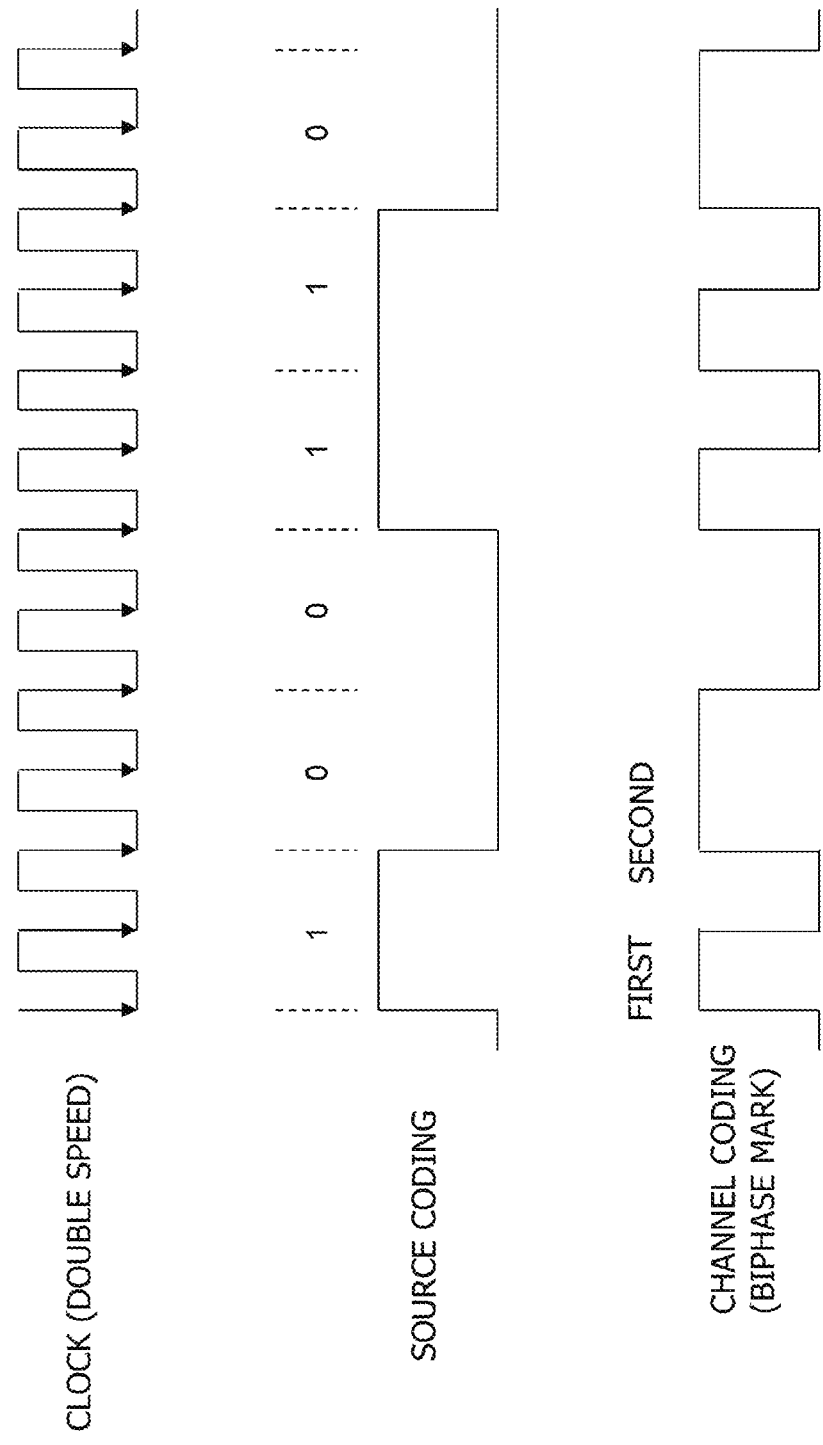
FIG. 13 is a diagram depicting a signal modulation system based on the standard IEC 60958.

FIG. 13 depicts a signal modulation system based on the standard IEC 60958. Biphase mark modulation is applied to the 4th to 31st time slots of the sub-frame excluding the preamble. A double-speed clock of the original signal (source coding) is used in the biphase mark modulation. When the clock cycle of the original signal is divided into a first half and a second half, the output of the biphase mark modulation is always inverted at the edge of the clock cycle of the first half. At the edge of the clock cycle of the second half, the output is inverted when the original signal indicates "1" and is not inverted when the original signal indicates "0." As a result, clock components in the original signal can be extracted from the signal subjected to the biphase mark modulation.

FIG. 14 depicts channel coding of the preamble based on the standard IEC 60958. As described, the biphase mark modulation is applied to the 4th to 31st time slots of the sub-frame. On the other hand, the normal biphase mark modulation is not applied to the preamble in the 0th to 3rd time slots, and the preamble is handled as a bit pattern synchronized with the double-speed clock. More specifically, 2 bits are allocated to each of the 0th to 3rd time slots to obtain an 8-bit pattern as depicted in FIG. 14.

When the preceding state is "0," "11101000" is allocated to the preamble "B," "11100010" is allocated to "M," and "1100100" is allocated to "W." On the other hand, when the preceding state is "1," "00010111" is allocated to the preamble "B," "00011101" is allocated to "M," and "00011011" is allocated to "W."

Figure 15:
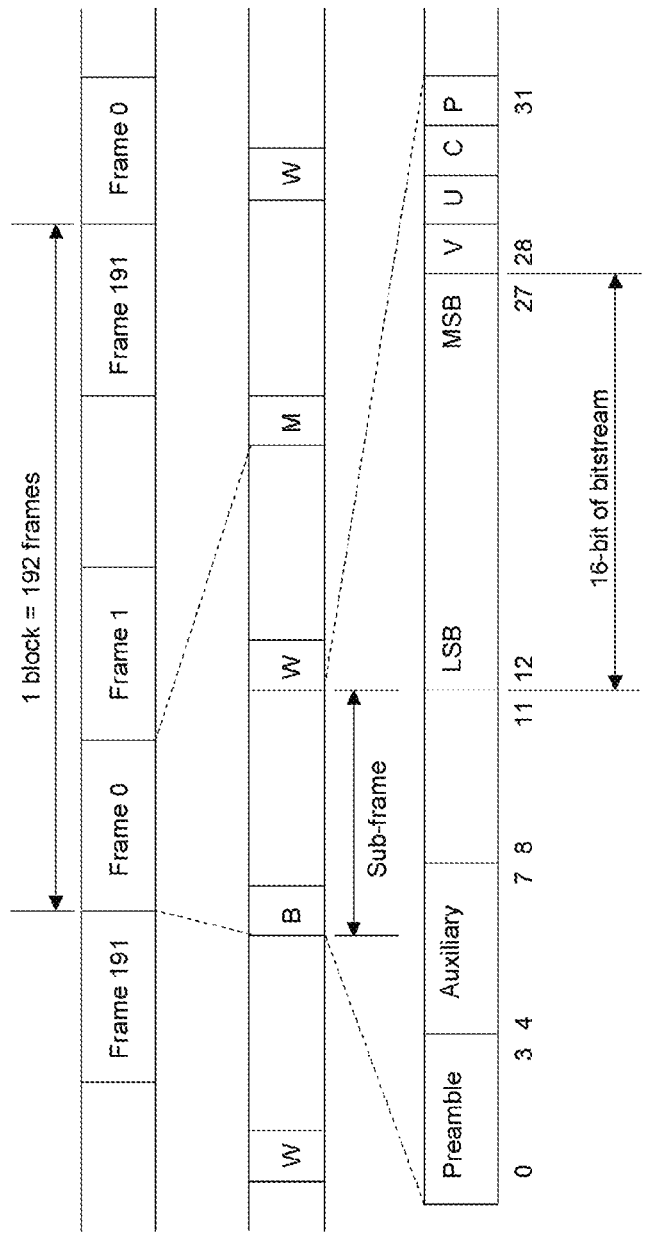
FIGS. 15(a), 15(b), and 15(c) is a are diagrams depicting an IEC 60958 interface format.

FIGS. 15(a), 15(b), and 15(c) depicts an IEC 60958 interface format (IEC 60958 interface format). In FIG. 15(a) depicts a frame configuration. 192 frames constitute one block, and the blocks are continuous. In FIG. 15(b) depicts that each frame includes two sub-frames.

The preamble is set at the head of the sub-frame, and "B" indicating the start of the block is provided to the preamble of the sub-frame at the head of the block. "W" and "M" are alternately provided to the preambles at the heads of the following sub-frames.

In FIG. 15(c) depicts a sub-frame configuration. In the case of the SPDIF signal including the compressed digital audio signal SA of the predetermined number of channels, the bitstream of the compressed digital audio signal SA is divided and sequentially inserted into the 12th to 27th time slots of each sub-frame.

FIG. 16 schematically depicts a format of the channel status in the case of the SPDIF signal including the compressed digital audio signal SA of the predetermined number of channels. Although the entire channel status includes 0th to 23rd bytes, only the part of the 0th to 5th bytes is depicted in the illustrated example.

In the 0th bit (bit 0), a="0" indicates that the channel status is for consumer use. In the 1st bit (bit 1), b="1" indicates that the channel status is in the IEC 61937 format, that is, the channel status is used for sending the compressed digital audio signal. Note that how to use the 0th bit (bit 0) and the 1st bit (bit 1) is defined in IEC 60958-1 as depicted in FIG. 17.

The first metadata, that is, metadata "IEC 60958 Frame Rate" indicating the sending frequency of the compressed digital audio signal, is inserted into the 24th to 27th bits and the 30th and 31st bits. FIG. 18 depicts a correspondence between bit values of the 24th to 27th bits and the 30th and 31st bits and sending frequencies indicated by the bit values. For example, when the bit value of the 24th to 27th bits is assigned to "0100b," the sending frequency is 48 kHz. For example, when the bit value of the 24th to 27th bits is assigned to "0101b," the sending frequency is 96 kHz.

The "IEC 60958 Frame Rate" is a fundamental frequency for locking the PLL when an IEC 60958-3 digital audio signal (SPDF signal) is received. Since the metadata is added, and the modulation is applied, the actual rate is 128 times the rate. More specifically, when the sending frequency indicated in the "IEC 60958 Frame Rate" is 48 kHz, the PLL is actually locked at 6.144 MHz. This is defined in IEC 60958-1.

A payload of up to 32 bits is allocated to the "IEC 60958 Frame Rate" in the compressed digital audio signal defined in IEC 61937, and a compressed digital audio signal of up to approximately 1.5 Mbps can be transmitted when the "IEC 60958 Frame Rate" is 48 kHz. An overhead, such as a packet header, is actually necessary, and this is defined in IEC 61937-1.

Returning to FIG. 16, the second metadata, that is, metadata "Original sampling frequency" indicating the sampling frequency used for converting the uncompressed digital audio signal of each channel into an analog signal, is inserted into the 36th to 39th bits. FIG. 19 depicts a correspondence between bit values of the 36th to 39th bits and sampling frequencies indicated by the bit values. For example, when the bit value of the 36th to 39th bits is assigned to "1011b," the sampling frequency is 48 kHz.

Returning to FIG. 16, the third metadata, that is, metadata "Audio sampling frequency coefficient" indicating the ratio of the sending frequency to the sampling frequency, is inserted into the 44th to 47th bits. FIG. 20 depicts a correspondence between bit values of the 44th to 47th bits and ratios indicated by the bit values. For example, when the bit value of the 44th to 47th bits is assigned to "1111b," the ratio is 2.

It is planned in the next-generation television broadcast to broadcast the compressed digital audio signal of MPEG-4 AAC of 22.2 channels at up to 1.9 Mbps in 48 kHz sampling. However, this cannot be output at "IEC 60958 Frame Rate"=48 kHz. Therefore, it can be considered to output the signal at "IEC 60958 Frame Rate"=96 kHz.

In this case, the first, second, and third metadata can be used, and the following information
"IEC 60958 Frame Rate"=96 kHz
"Original sampling frequency"=48 kHz
"Audio sampling frequency coefficient"=×2
can be added to the compressed digital audio signal of MPEG-4 AAC to favorably send the compressed digital audio signal.

More specifically, the sending frequency of the compressed digital audio signal can be correctly recognized from the information "IEC 60958 Frame Rate"=96 kHz on the receiving side, and the PLL can be locked at 96 kHz (×128) to correctly execute the decoding process. On the receiving side, the uncompressed digital audio signal of each channel obtained by the decoding process can be correctly converted into an analog signal at the sampling frequency of 48 kHz based on the information "Original sampling frequency"=48 kHz, and the reproduction at 48 kHz can also be correctly presented to the user.

On the receiving side, the ratio of the sending frequency to the sampling frequency can be correctly recognized from the information "Audio sampling frequency coefficient"=2, and whether or not the relationship between the "IEC 60958 Frame Rate" and the "Original sampling frequency" matches the ratio can be determined to recognize that the information of the "IEC 60958 Frame Rate" and the "Original sampling frequency" is in a correct state.

As described, in the AV system 10 depicted in FIG. 1, the television receiver 100 adds the first metadata indicating the sending frequency of the compressed audio signal, the second metadata indicating the sampling frequency used for converting the uncompressed digital audio signal of each channel into an analog signal, and the third metadata indicating the ratio of the sending frequency to the sampling frequency are added to the compressed digital audio signal of the predetermined number of channels included in the SPDIF signal to be transmitted to the audio amplifier 200.

Therefore, the compressed digital audio signal with a high data rate can be sent favorably. More specifically, the signal can be sent at a sending rate different from the sampling frequency. On the receiving side, the sound can be correctly reproduced at the original sampling frequency different from the sending rate, and the audio frequency band for actually reproducing the sound can be clearly presented to the user.

In the AV system 10 depicted in FIG. 1, the audio amplifier 200 executes the process related to the compressed digital audio signal included in the SPDIF signal based on the first metadata, the second metadata, and the third metadata added to the compressed digital audio signal, the first metadata indicating the sending frequency of the compressed digital audio signal, the second metadata indicating the sampling frequency used for converting the uncompressed digital audio signal of each channel into an analog signal, and the third metadata indicating the ratio of the sending frequency to the sampling frequency. Therefore, the process related to the compressed digital audio signal, such as a decoding process, a process of converting the signal into an analog signal, and a process of clearly presenting the reproduction audio frequency band to the user, can be appropriately executed.

2. Modification

Note that the HDMI audio return channel (ARC) is used to send the SPDIF signal from the television receiver 100 to the audio amplifier 200 in the example illustrated in the embodiment. More specifically, the HDMI ARC is used as an IEC 60958 sending path in the example. The present technique can be similarly applied to an example of using a coaxial cable or an optical cable as an IEC 60958 sending path.

Figure 21:
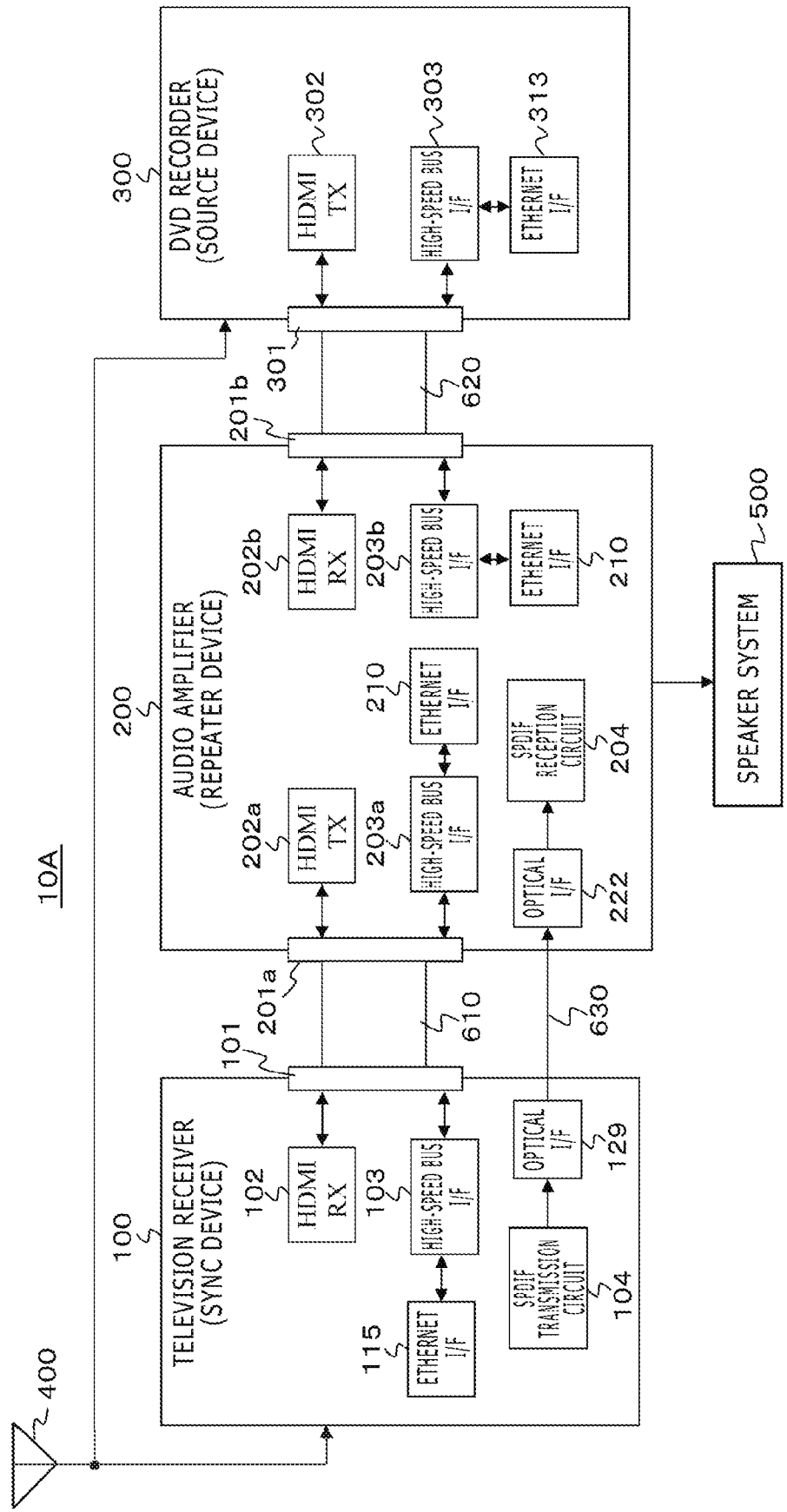

FIG. 21 depicts a configuration example of an AV system 10A when an optical cable is used as an IEC 60958 sending path. In FIG. 21, the same reference signs are provided to the parts corresponding to FIG. 1, and the detailed description will not be repeated. In the AV system 10A, the television receiver 100 includes an optical interface 129, and the audio amplifier 200 includes an optical interface 222. The SPDIF signal output from the SPDIF transmission circuit 104 of the television receiver 100 is sent to the SPDIF reception circuit 204 of the audio amplifier 200 through the optical interface 129, an optical cable 630, and the optical interface 222.

Note that the example of using the HDMI ARC as an IEC 60958 sending path (see FIG. 1) and the example of using the coaxial cable or the optical cable as an IEC 60958 sending path (see FIG. 21) are mentioned in the embodiment.

In addition, an example of using an HDMI sending path as an IEC 60958 sending path can also be considered. In this case, the SPDIF signal (IEC 60958 signal) is mapped in an audio sample packet and is sent in the same forward direction as in the video sending. Similarly, examples of using an IEC 61883-9 sending path, an MHL sending path, a display port sending path (DP sending path), or the like as an IEC 60958 sending path can also be considered. In these cases, the SPDIF signal (IEC 60958 signal) is also mapped in the audio sample packet and is also sent in the same forward direction as in the video transmission.

The compressed digital audio signal SA included in the SPDIF signal is acquired from the broadcast signal in the example illustrated in the embodiment. However, the compressed digital audio signal SA may be reproduced and acquired from a recording medium.

The technique can also have the following configurations.

(1) A transmission apparatus including:

a metadata addition unit that adds, to a compressed digital audio signal of a predetermined number of channels, first metadata indicating a sending frequency of the compressed digital audio signal, second metadata indicating a sampling frequency used for converting an uncompressed digital audio signal of each channel into an analog signal, and third metadata indicating a ratio of the sending frequency to the sampling frequency; and a transmission unit that transmits the compressed digital audio signal provided with each type of the metadata to an external device through a predetermined sending path.

(2) The transmission apparatus according to (1), wherein the transmission unit sequentially transmits the compressed digital audio signal on a basis of unit data, and the metadata addition unit uses a predetermined bit area of a channel status of each block constituted by a predetermined number of continuous pieces of the unit data to add each type of the metadata.

(3) The transmission apparatus according to (1) or (2), wherein an encoding system of the compressed digital audio signal is MPEG-4 AAC.

(4) The transmission apparatus according to (3), wherein the predetermined number of channels is 22.2 channels.

(5) The transmission apparatus according to any one of (1) to (4), wherein the predetermined sending path is a coaxial cable, an optical cable, an Ethernet (IEC 61883-6) cable, an HDMI cable, an MHL cable, or a display port cable.

(6) The transmission apparatus according to any one of (1) to (5), further including an acquisition unit that acquires the compressed digital audio signal from a broadcast signal or that reproduces the compressed digital audio signal from a recording medium to acquire the compressed digital audio signal.

(7) A transmission method including:

a metadata addition step of adding, to a compressed digital audio signal of a predetermined number of channels, first metadata indicating a sending frequency of the compressed digital audio signal, second metadata indicating a sampling frequency used for converting an uncompressed digital audio signal of each channel into an analog signal, and third metadata indicating a ratio of the sending frequency to the sampling frequency; and a transmission step of transmitting, by a transmission unit, the compressed digital audio signal provided with each type of the metadata to an external device through a predetermined sending path.

(8) A reception apparatus including:

a reception unit that receives a compressed digital audio signal of a predetermined number of channels from an external device through a predetermined sending path, wherein first metadata indicating a sending frequency of the compressed digital audio signal, second metadata indicating a sampling frequency used for converting an uncompressed digital audio signal of each channel into an analog signal, and third metadata indicating a ratio of the sending frequency to the sampling frequency are added to the compressed digital audio signal; and a processing unit that executes a process related to the compressed digital audio signal based on at least one type of the metadata.

(9) The reception apparatus according to (8), wherein the processing unit locks a PLL to a frequency according to the sending frequency indicated in the first metadata and uses a clock signal at the frequency locked by the PLL to apply a decoding process to the compressed digital audio signal to obtain an uncompressed digital audio signal of each channel of the predetermined number of channels.

(10) The reception apparatus according to (8) or (9), wherein the processing unit converts the uncompressed digital audio signal of each channel obtained by applying the decoding process to the compressed digital audio signal into an analog signal at the sampling frequency indicated in the second metadata and outputs the analog signal.

(11) The reception apparatus according to any one of (8) to (10), wherein the processing unit displays, on a display unit, the sampling frequency indicated in the second metadata as a sampling frequency of the output analog audio signal of each channel.

(12) The reception apparatus according to any one of (8) to (11), wherein the processing unit uses the sending frequency indicated in the first metadata or the ratio indicated in the third metadata to display the sending frequency of the compressed digital audio signal on the display unit.

(13) The reception apparatus according to any one of (8) to (13), wherein the processing unit compares a ratio of the sending frequency indicated in the first metadata to the sampling frequency indicated in the second metadata with the ratio indicated in the third metadata to detect an error of the first metadata or the second metadata.

(14) The reception apparatus according to any one of (8) to (13), wherein the reception unit sequentially receives the compressed digital audio signal on a basis of unit data, and a predetermined bit area of a channel status of each block constituted by a predetermined number of continuous pieces of the unit data is used to add each type of the metadata to the compressed digital audio signal.

(15) The reception apparatus according to any one of (8) to (14), wherein the predetermined sending path is a coaxial cable, an optical cable, an Ethernet (IEC 61883-6) cable, an HDMI cable, an MHL cable, or a display port cable.

(16) A reception method including:

a reception step of receiving, by a reception unit, a compressed digital audio signal of a predetermined number of channels from an external device through a predetermined sending path, wherein first metadata indicating a sending frequency of the compressed digital audio signal, second metadata indicating a sampling frequency used for converting an uncompressed digital audio signal of each channel into an analog signal, and third metadata indicating a ratio of the sending frequency to the sampling frequency are added to the compressed digital audio signal; and a processing step of executing a process related to the compressed digital audio signal based on at least one type of the metadata.

REFERENCE SIGNS LIST

10 . . . AV system
100 . . . Television receiver
101 . . . HDMI terminal
102 . . . HDMI reception unit 103 . . . High-speed bus interface
104 . . . SPDIF transmission circuit
105 . . . Antenna terminal
106 . . . Digital broadcast tuner
107 . . . MPEG decoder
108 . . . Video signal processing circuit
109 . . . Graphic generation circuit
110 . . . Panel drive circuit
111 . . . Display panel
112 . . . Audio signal processing circuit
113 . . . Audio amplifier circuit
114 . . . Speaker
115 . . . Ethernet interface
116 . . . Network terminal
120 . . . Internal bus
121 . . . CPU
122 . . . Flash ROM
123 . . . DRAM
124 . . . Display control unit
125 . . . Remote control reception unit
126 . . . Remote control transmitter
127 . . . Power supply unit
128 . . . Plug connection transfer circuit
200 . . . Audio amplifier
201a, 201b . . . HDMI terminals
202a . . . HDMI transmission unit
202b . . . HDMI reception unit
203a, 203b . . . High-speed bus interfaces
204 . . . SPDIF reception circuit
205 . . . MPEG decoder
206 . . . Video graphic processing circuit
207 . . . Audio processing circuit
208 . . . Audio amplifier circuit
209 . . . Audio output terminal
210 . . . Ethernet interface
211 . . . Internal bus
212 . . . CPU
213 . . . Flash ROM
214 . . . DRAM
215 . . . Display control unit
216 . . . Panel drive circuit
217 . . . Display panel
218 . . . Power supply unit
219 . . . Remote control reception unit
220 . . . Remote control transmitter
221 . . . Plug connection detection circuit
300 . . . BD player
301 . . . HDMI terminal
302 . . . HDMI transmission unit
303 . . . High-speed bus interface
304 . . . Internal bus
305 . . . CPU
306 . . . Flash ROM
307 . . . SDRAM
308 . . . Display control unit
309 . . . Remote control reception unit
310 . . . Remote control transmitter
311 . . . Storage medium control interface
312a . . . BD drive
312b . . . HDD
312c . . . SSD
313 . . . Ethernet interface
314 . . . Network terminal
315 . . . MPEG decoder
316 . . . Graphic generation circuit
317 . . . Video output terminal
318 . . . Audio output terminal
319 . . . Panel drive circuit
320 . . . Display panel
321 . . . Power supply unit
400 . . . Reception antenna
500 . . . Speaker system
610, 620 . . . HDMI cables
630 . . . Optical cable

The invention claimed is:

1. A transmission apparatus, comprising:
a metadata addition unit configured to add first metadata, second metadata, and third metadata, to a compressed digital audio signal of each channel of a specific number of channels, wherein
the first metadata indicates a sending frequency of the compressed digital audio signal,
the second metadata indicates a sampling frequency,
a conversion of an uncompressed digital audio signal of the each channel of the specific number of channels into an analog signal is based on the sampling frequency, and
the third metadata indicates a ratio of the sending frequency to the sampling frequency; and
a transmission unit configured to transmit, via a specific path, the compressed digital audio signal of the each channel with the first metadata, the second metadata, and the third metadata to an external device.

2. The transmission apparatus according to claim 1, wherein
the transmission unit is further configured to sequentially transmit the compressed digital audio signal of the each channel of the specific number of channels based on unit data,
the unit data includes a plurality of blocks,
the metadata addition unit is further configured to add the first metadata, the second metadata, and the third metadata to the compressed digital audio signal based on a specific bit area of a channel status of each block of the plurality of blocks, and the each block includes a specific number of continuous pieces of the unit data.

3. The transmission apparatus according to claim 1, wherein an encoding system of the compressed digital audio signal is moving picture experts group-4 adaptive audio coding.

4. The transmission apparatus according to claim 3, wherein the specific number of channels is 22.2 channels.

5. The transmission apparatus according to claim 1, wherein
the specific path is one of a coaxial cable, an optical cable, an Ethernet cable, a high definition multimedia interface cable, a mobile high-definition link cable, or a display port cable, and
the Ethernet cable is an international electrotechnical commission (IEC) 61883-6 cable.

6. The transmission apparatus according to claim 1, further comprising an acquisition unit configured to one of
acquire the compressed digital audio signal from a broadcast signal, or
reproduce the compressed digital audio signal from a recording medium to acquire the compressed digital audio signal from the recording medium.

7. A transmission method, comprising:
adding first metadata, second metadata, and third metadata to a compressed digital audio signal of each channel of a specific number of channels, wherein
the first metadata indicates a sending frequency of the compressed digital audio signal,
the second metadata indicates a sampling frequency;

a conversion of an uncompressed digital audio signal of the each channel of the specific number of channels into an analog signal is based on the sampling frequency, and the third metadata indicates a ratio of the sending frequency to the sampling frequency; and transmitting, via a specific path, the compressed digital audio signal of the each channel with the first metadata, the second metadata, and the third metadata to an external device.

8. A reception apparatus, comprising:

a reception unit configured to receive a compressed digital audio signal of each channel of a specific number of channels, wherein the compressed digital audio signal is received from an external device via a specific path, the compressed digital audio signal is received with first metadata, second metadata, and third metadata, the first metadata indicates a sending frequency of the compressed digital audio signal, the second metadata indicates a sampling frequency, a conversion of an uncompressed digital audio signal of the each channel of the specific number of channels into an analog signal is based on the sampling frequency, and the third metadata indicates a ratio of the sending frequency to the sampling frequency; and a processing unit configured to execute a process associated with the compressed digital audio signal based on at least one of the first metadata, the second metadata or the third metadata.

9. The reception apparatus according to claim 8, wherein the processing unit is further configured to:

lock a phase-locked loop to a frequency based on the sending frequency;

apply a decoding process to the compressed digital audio signal based on a clock signal at the frequency locked by the phase-locked loop; and obtain the uncompressed digital audio signal of the each channel of the specific number of channels based on the decoding process.

10. The reception apparatus according to claim 9, wherein the processing unit is further configured to:

convert the uncompressed digital audio signal of the each channel of the specific number of channels into the analog signal at the sampling frequency; and output the analog signal.

11. The reception apparatus according to claim 8, wherein the processing unit is further configured to control a display screen to display the sampling frequency as a sampling frequency of an output analog audio signal of the each channel of the specific number of channels.

12. The reception apparatus according to claim 8, wherein the processing unit is further configured to control a display screen to display the sending frequency of the compressed digital audio signal, and the sending frequency of the compressed digital audio signal is displayed based on at least one of the first metadata or the third metadata.

13. The reception apparatus according to claim 8, wherein the processing unit is further configured to:

compare a ratio of the sending frequency indicated in the first metadata to the sampling frequency indicated in the second metadata with the ratio indicated in the third metadata; and detect an error of one of the first metadata or the second metadata based on the comparison.

14. The reception apparatus according to claim 8, wherein the reception unit is further configured to sequentially receive the compressed digital audio signal of the each channel of the specific number of channels based on unit data, the unit data includes a plurality of blocks, the first metadata, the second metadata, and the third metadata are added to the compressed digital audio signal based on a specific bit area of a channel status of each block of the plurality of blocks, and the each block includes a specific number of continuous pieces of the unit data.

15. The reception apparatus according to claim 8, wherein the specific path is one of a coaxial cable, an optical cable, an Ethernet cable, a high definition multimedia interface cable, a mobile high-definition link cable, or a display port cable, and the Ethernet cable is an international electrotechnical commission (IEC) 61883-6 cable.

16. A reception method, comprising:

receiving a compressed digital audio signal of each channel of a specific number of channels, wherein the compressed digital audio signal is received from an external device via a specific path, the compressed digital audio signal is received with first metadata, second metadata, and third metadata, the first metadata indicates a sending frequency of the compressed digital audio signal, the second metadata indicates a sampling frequency, a conversion of an uncompressed digital audio signal of the each channel of the specific number of channels into an analog signal is based on the sampling frequency, and the third metadata indicates a ratio of the sending frequency to the sampling frequency; and executing a process associated with the compressed digital audio signal based on at least one the first metadata, the second metadata or the third metadata.

* * * * *